(12) United States Patent
Fujiwara et al.

(10) Patent No.: US 12,137,548 B2
(45) Date of Patent: *Nov. 5, 2024

(54) FOUR CPP WIDE MEMORY CELL WITH BURIED POWER GRID, AND METHOD OF FABRICATING SAME

(71) Applicant: TAIWAN SEMICONDUCTOR MANUFACTURING COMPANY, LTD., Hsinchu (TW)

(72) Inventors: Hidehiro Fujiwara, Hsinchu (TW); Chih-Yu Lin, Hsinchu (TW); Yen-Huei Chen, Hsinchu (TW); Wei-Chang Zhao, Hsinchu (TW); Yi-Hsin Nien, Hsinchu (TW)

(73) Assignee: TAIWAN SEMICONDUCTOR MANUFACTURING COMPANY, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/155,932

(22) Filed: Jan. 18, 2023

(65) Prior Publication Data

US 2023/0156995 A1 May 18, 2023

Related U.S. Application Data

(63) Continuation of application No. 17/225,627, filed on Apr. 8, 2021, now Pat. No. 11,569,246.

(Continued)

(51) Int. Cl.
*H10B 10/00* (2023.01)
*G06F 30/392* (2020.01)
(Continued)

(52) U.S. Cl.
CPC ........... *H10B 10/12* (2023.02); *G06F 30/392* (2020.01); *H01L 23/5226* (2013.01); *H01L 23/5286* (2013.01); *G03F 1/70* (2013.01)

(58) Field of Classification Search
CPC . H10B 10/12; H01L 23/5226; H01L 23/5286; G06F 30/392; G03F 1/70
(Continued)

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |

(Continued)

FOREIGN PATENT DOCUMENTS

| | | |
|---|---|---|
| KR | 20190098078 | 8/2019 |
| KR | 20200034227 | 3/2020 |

(Continued)

OTHER PUBLICATIONS

Office Action dated Jun. 30, 2022 for corresponding case No. KR 10-2021-0073689 (pp. 1-3). English abstract attached on p. 1.

*Primary Examiner* — Tu-Tu V Ho
(74) *Attorney, Agent, or Firm* — Hauptman Ham, LLP

(57) ABSTRACT

A memory device includes active regions and gate structures, each of the gate structures is electrically coupled to a first portion of a corresponding active region of the active regions. The memory device includes contact-to-transistor-component structures (MD structures), each of the MD structures is over a second portion of a corresponding active region, and a first MD structure is between adjacent gate structures. The memory device includes via-to-gate/MD (VGD) structures, each of the VGD structures is over to a corresponding gate electrode and MD structure. The memory device includes conductive segments, each of the conductive segments is over and electrically coupled to a corresponding VGD structure. The memory device includes buried contact-to-transistor-component structures (BVD) structures, each of the BVD structures is under a third portion of a corresponding active region. The memory device includes buried conductive segments, each of the (Continued)

buried conductive segments is under a corresponding BVD structure.

20 Claims, 21 Drawing Sheets

Related U.S. Application Data

(60) Provisional application No. 63/045,483, filed on Jun. 29, 2020.

(51) Int. Cl.
*H01L 23/522* (2006.01)
*H01L 23/528* (2006.01)
*G03F 1/70* (2012.01)

(58) Field of Classification Search
USPC .......................................... 257/369
See application file for complete search history.

(56) References Cited

U.S. PATENT DOCUMENTS

| | | | |
|---|---|---|---|
| 10,546,855 | B2 | 1/2020 | Ranjan et al. |
| 11,569,246 | B2 * | 1/2023 | Fujiwara ............... G06F 30/392 |
| 2014/0040838 | A1 | 2/2014 | Liu et al. |
| 2015/0278429 | A1 | 10/2015 | Chang |
| 2018/0374791 | A1 | 12/2018 | Smith et al. |
| 2020/0019667 | A1 | 1/2020 | Lin et al. |
| 2020/0105761 | A1 | 4/2020 | Liaw |

FOREIGN PATENT DOCUMENTS

| | | |
|---|---|---|
| KR | 20200037108 | 4/2020 |
| TW | 202018721 | 5/2020 |
| TW | I694305 | 5/2020 |

* cited by examiner

US 12,137,548 B2

FOUR CPP WIDE MEMORY CELL WITH BURIED POWER GRID, AND METHOD OF FABRICATING SAME

PRIORITY CLAIM AND CROSS-REFERENCE

The present application is a continuation of U.S. application Ser. No. 17/225,627, filed Apr. 8, 2021, now U.S. Pat. No. 11,569,246, issued Jan. 31, 2023, which claims the priority of U.S. Provisional Application No. 63/045,483, filed Jun. 29, 2020, which is incorporated herein by reference in their entireties.

BACKGROUND

An integrated circuit ("IC") includes one or more semiconductor devices. One way in which to represent a semiconductor device is with a plan view diagram referred to as a layout diagram. Layout diagrams are generated in a context of design rules. A set of design rules imposes constraints on the placement of corresponding patterns in a layout diagram, e.g., geographic/spatial restrictions, connectivity restrictions, or the like. Often, a set of design rules includes a subset of design rules pertaining to the spacing and other interactions between patterns in adjacent or abutting cells where the patterns represent conductors in a layer of metallization.

Typically, a set of design rules is specific to a process/technology node by which will be fabricated a semiconductor device based on a layout diagram. The design rule set compensates for variability of the corresponding process/technology node. Such compensation increases the likelihood that an actual semiconductor device resulting from a layout diagram will be an acceptable counterpart to the virtual device on which the layout diagram is based.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
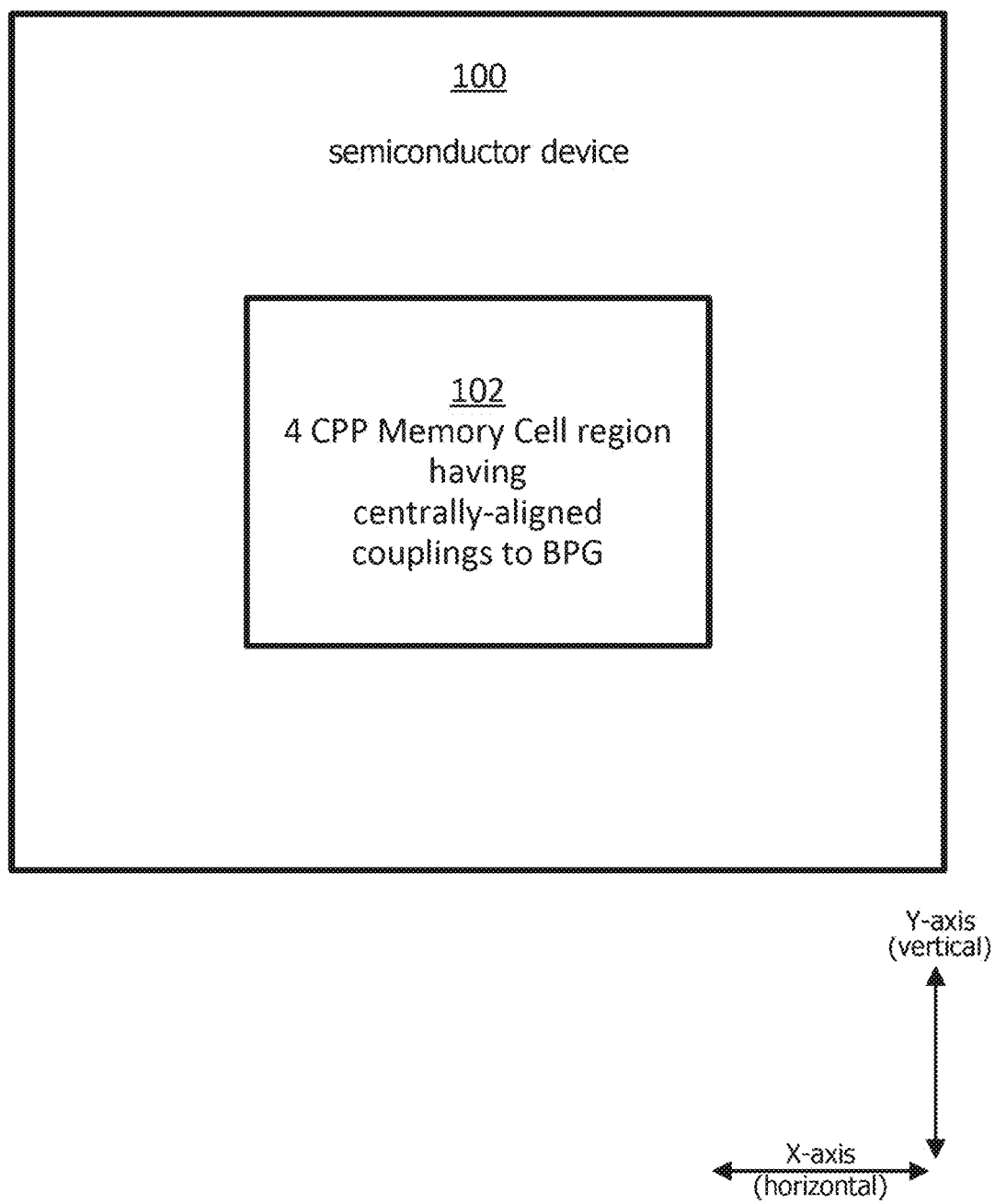
FIG. 1 is a block diagram of a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, buried contact-to-transistor-component structures (BVD structures) which are under and electrically coupled to corresponding portions of corresponding active regions; and buried conductive segments which are in a first buried layer of metallization (BM_1st layer), extend in the first direction, and are under and electrically coupled to corresponding ones of the BVD structures, and correspondingly provide a first reference voltage or a second reference voltage. According to another approach, a BM0 layer is not provided and instead some of the M0 patterns are used as power grid (PG) patterns and are designated to provide correspondingly VDD and VSS, and corresponding MD patterns are provided for coupling the M0 PG patterns to corresponding portions of the active area (AA) patterns and are aligned on track T6. However, where width is defined as being relative to a short axis of a metallization pattern, the width of the M0 PG patterns according to the other approach is substantially the same as the width of M0 routing patterns. By moving the PG patterns to the BM0 layer, at least some embodiments provide PG patterns that are relatively wider than (and so suffer significantly smaller resistive (Ohmic) losses than) the M0 PG patterns according to the other approach. In addition, by moving the PG patterns to the BM0 layer, at least some embodiments suffer reduced routing congestion as compared to the other approach.

FIG. 1 is a block diagram of a semiconductor device 100, in accordance with some embodiments.

Semiconductor device 100 includes a region 102 which is a memory cell region that has a width of four contacted poly pitch (4 CPP). In addition, memory cell region 102 has electrical couplings to a power grid (PG) which is buried (BPG). In some embodiments, relative to a footprint of memory cell region 102, the electrical couplings are centrally aligned.

Figure 2A:
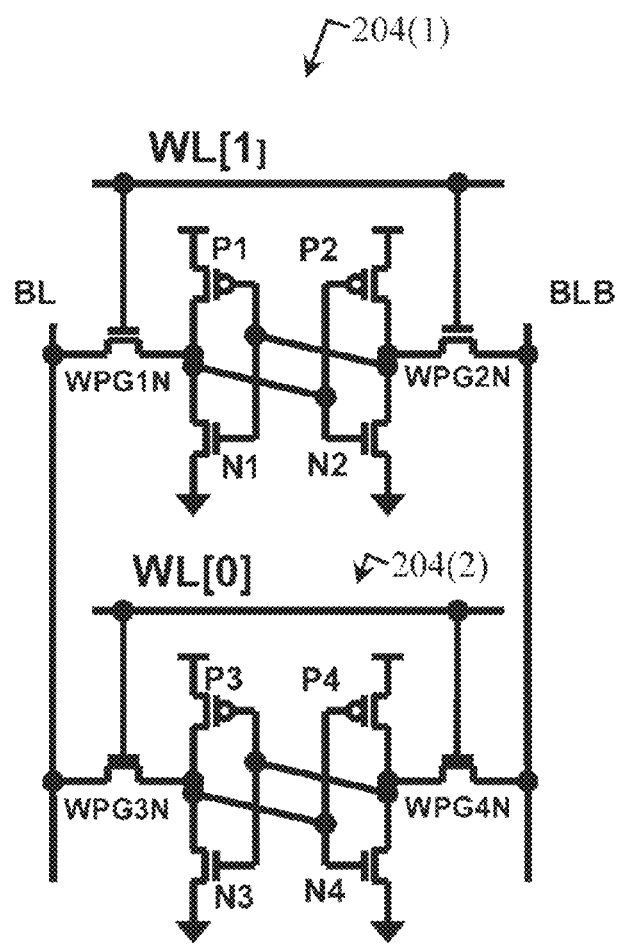
FIG. 2A is a circuit diagram, in accordance with some embodiments.

FIG. 2A is a circuit diagram of memory cells 204(1) and 204(2), in accordance with some embodiments.

Memory cell 204(1) includes a first memory latch. The first memory latch includes: a PMOS transistor P1 and an NMOS transistor N1 coupled in series between a first reference voltage and a second reference voltage; and a PMOS transistor P2 and an NMOS transistor N2 coupled in series between the first reference voltage and the second reference voltage. In some embodiments, the first reference voltage is VDD and the second reference voltage is VSS. In some embodiments, the first and second reference voltages are voltages correspondingly other than VDD and VSS. Gate electrodes of transistors P1 and N1 and drain electrodes of transistors P2 and N2 are coupled together. Gate electrodes of transistors P2 and N2 and drain electrodes of transistors P1 and N1 are coupled together.

Memory cell 204(1) includes: an NMOS write pass gate WPG1N coupled between the drain electrodes of transistors P1 and N1 and a bit line BL; and an NMOS write pass gate WPG2N coupled between the drain electrodes of transistors P2 and N2 and a bit_bar line BLB.

Gate electrodes of write pass gates WPG1N and WPG2N are coupled to a word line WL[1]. Accordingly, memory cell 204(1) is a six transistor (6T), single port (1P) type of memory cell (6T1P memory cell).

Memory cell 204(2) includes a second memory latch. The second memory latch includes: a PMOS transistor P3 and a NMOS transistor N3 coupled in series between VDD and VSS; and a PMOS transistor P4 and an NMOS transistor N4 coupled in series between VDD and VSS. Gate electrodes of transistors P3 and N3 and drain electrodes of transistors P4 and N4 are coupled together. Gate electrodes of transistors P4 and N4 and drain electrodes of transistors P3 and N3 are coupled together.

Memory cell 204(2) includes: an NMOS write pass gate WPG3N coupled between the drain electrodes of transistors P3 and N3 and bit line BL; and an NMOS write pass gate WPG4N coupled between the drain electrodes of transistors P4 and N4 and bit_bar line BLB. Gate electrodes of write pass gates WPG3N and WPG4N are coupled to a word line WL[0]. Accordingly, memory cell 204(2) is a 6T1P memory cell.

In FIG. 2A, bit line BL is shared by write pass gates WPG1N and WPG3N. Bit_bar line BLB is shared by write pass gates WPG2N and WPG4N.

Figure 2B:
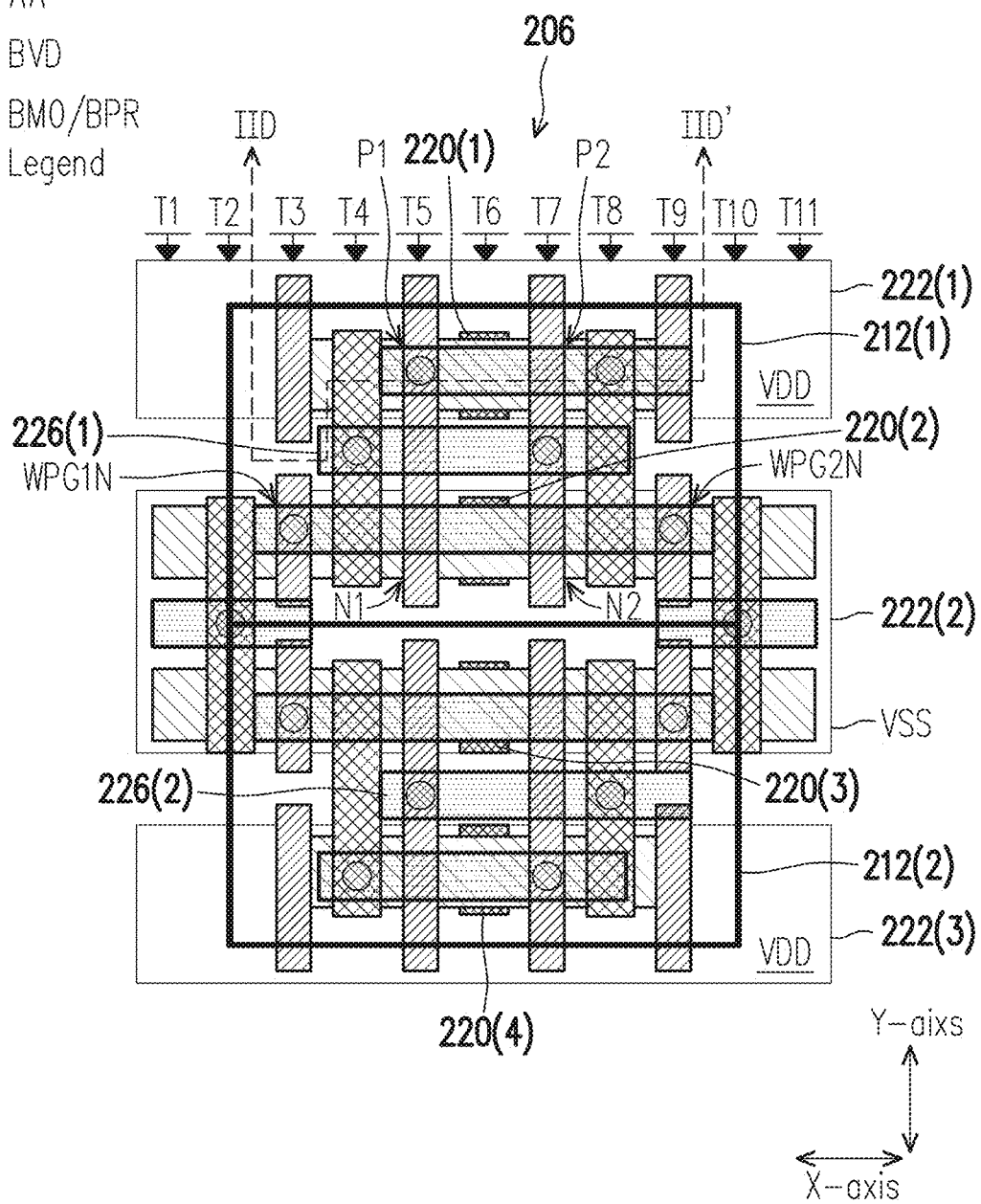
FIGS. 2B, 2C and 2E are corresponding layout diagrams, in accordance with some embodiments.
Figure 2C:
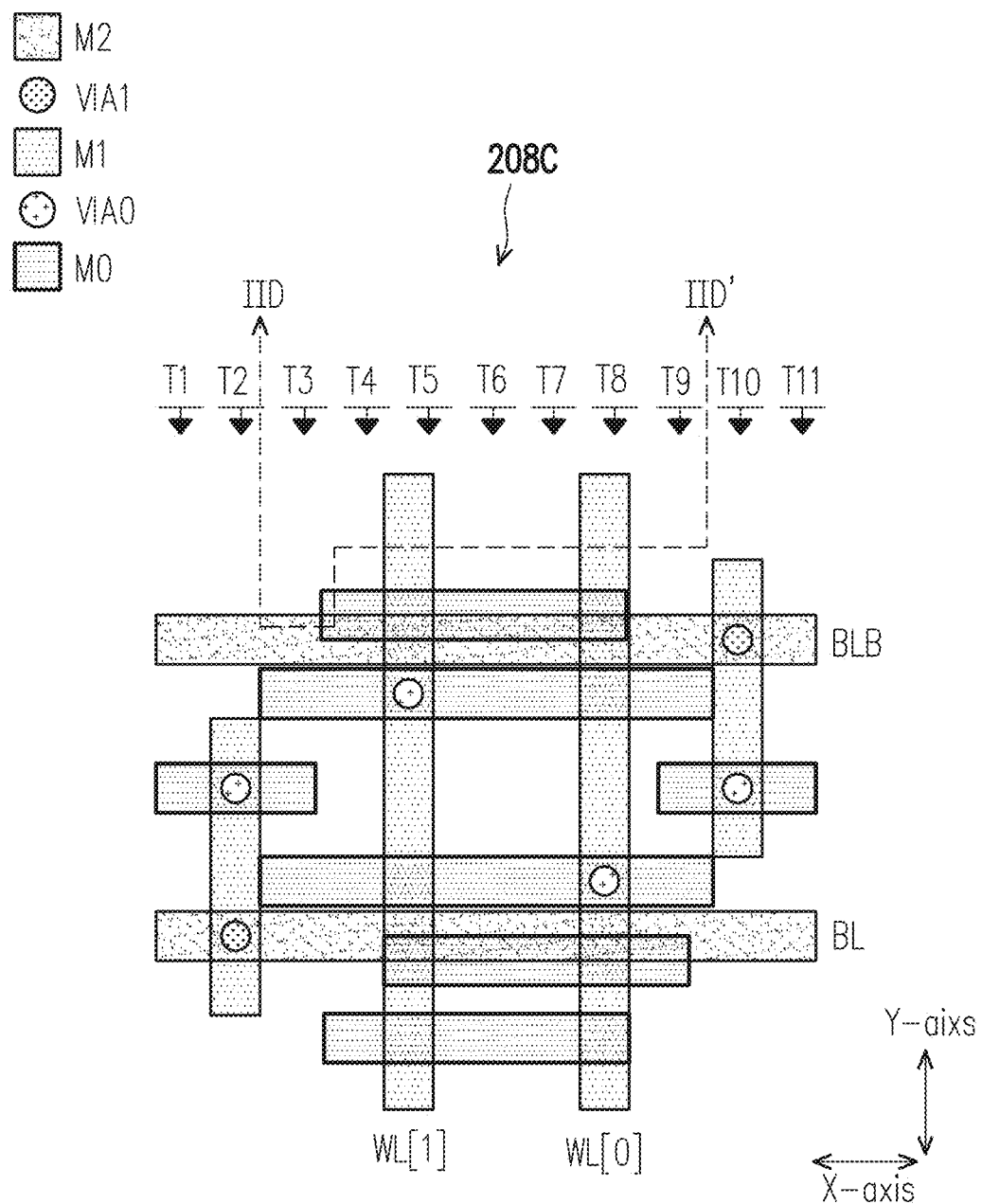

FIGS. 2B-2C are corresponding layout diagrams 206 and 208C, in accordance with some embodiments.

Figure 2D:
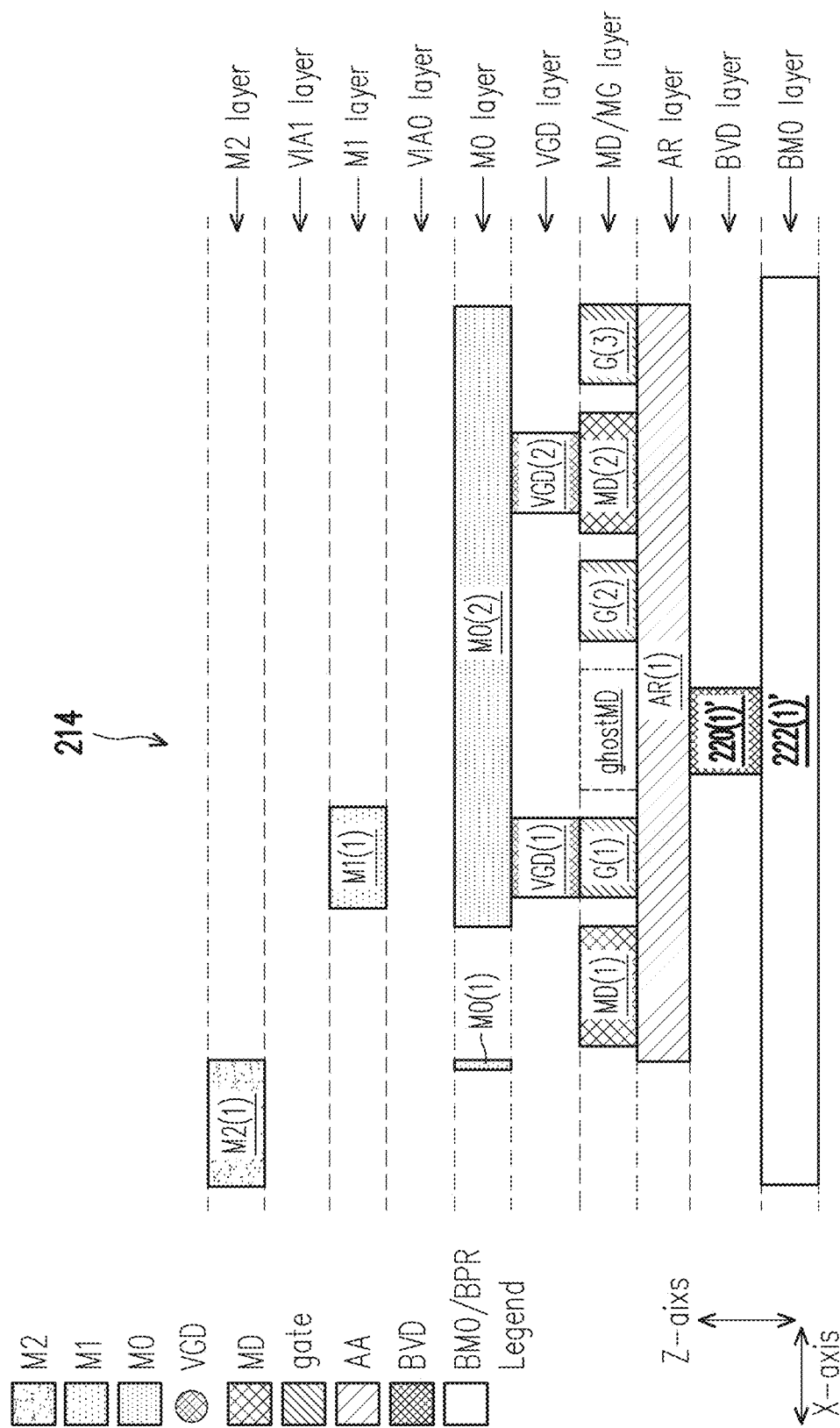
FIG. 2D is a cross-section, in accordance with some embodiments.

Layout diagram 206 represents a first portion of memory devices 204(1) and 204(2), the first portion corresponding to layers BM0 through M0 in FIG. 2D. Layout diagram 208C represents a second portion of memory cells 204(1) and 204(2), the second portion corresponding to layers M0 through M2 in FIG. 2D.

Layout diagram 206 includes cell boundaries 212(1) and 212(2) corresponding to memory cells 204(1) and 204(2) of FIG. 2A. Layout diagram 206 is organized according to track lines T1, T2, T3, T4, T5, T6, T7, T8, T9, T10, T11 and T12 which are parallel to a first direction.

In FIG. 2B, layout diagram 206 further includes: active area (AA) patterns which extend in a second direction that is perpendicular to the first direction; gate patterns which extend in the first direction and are over corresponding portions of corresponding ones of the AA patterns; and contact-to-transistor-component patterns (MD patterns) which extend in the first direction and are over corresponding portions of corresponding ones of the AA patterns. In some embodiments, the first direction is the Y-axis and the second direction is the X-axis. In some embodiments, the first and second directions are correspondingly something other than the Y-axis and the X-axis.

In some embodiments, relative to the X-axis, adjacent track lines are separated by one-half a unit of contacted poly pitch (CPP). Typically, the unit of CPP is specific to a corresponding process node by which will be fabricated a semiconductor device based on a corresponding layout diagram. For example, track lines T3 and T4 are separated by CPP/2, and track lines T3 and T5 are separated by 1*CPP.

Relative to the X-axis: a left edge of each of cell boundaries 212(1) and 212(2) is aligned with track T2; and a right edge of each of cell boundaries 212(1) and 212(2) is aligned with track T10. Also, relative to the X-axis, track T6 represents a midline of each of cell boundaries 212(1) and 212(2).

Relative to the X-axis, the gate patterns and MD patterns are interspersed and non-overlapping of each other. For example, one MD pattern which is located in cell boundary 212(1) and is aligned with track T4 is located between (A) two gate patterns which are located substantially in cell boundary 212(1) and are aligned on track T3, and (B) one gate pattern which is located substantially in cell boundary 212(1) is aligned on track T5.

Relative to the Y-axis, corresponding ones of the gate patterns are aligned to corresponding ones of the tracks, and corresponding ones of the MD patterns are aligned with corresponding ones of the MD patterns. In some embodiments, long axes of symmetry of the gate patterns are substantially collinear with corresponding ones of the tracks, and long axes of symmetry of the MD patterns are substantially collinear with corresponding ones of the tracks.

More particularly regarding the gate patterns, two gate patterns which are located substantially in cell boundary 212(1) and two gate patterns which are located substantially in cell boundary 212(2) are aligned on track T3. One gate pattern which is located substantially in cell boundary 212(1) and one gate pattern located substantially in cell boundary 212(2) are aligned on track T5. One gate pattern which is located substantially in cell boundary 212(1) and one gate pattern located substantially in cell boundary 212(2) are aligned on track T7. Two gate patterns which are located substantially in cell boundary 212(1) and two gate patterns which are located substantially in cell boundary 212(2) are aligned on track T9.

More particularly, regarding the MD patterns, one MD pattern which is partially in cell boundary 212(1) and partially in in cell boundary 212(2) is aligned on track T2. One MD pattern which is located in cell boundary 212(1) and one MD pattern which is located in cell boundary 212(2)

are aligned on track T4. One MD pattern which is located in cell boundary 212(1) and one MD pattern which is located in cell boundary 212(2) are aligned on track T8. One MD pattern which is partially in cell boundary 212(1) and partially in in cell boundary 212(2) is aligned on track T10.

The MD pattern aligned on track T2 represents the shared BL of FIG. 2A. The MD pattern aligned on track T2 represents the shared BL of FIG. 2A.

In FIG. 2B, it is noted that no MD patterns nor gate patterns are aligned on track T6. It is further noted that the gate patterns of each of cell boundaries 212(1) and 212(2) are substantially aligned relative to four corresponding track lines, namely tracks T3, T5, T7 and T8. Accordingly, each of cell boundaries 212(1) and 212(2) has a width of four contacted poly pitch (4 CPP) relative to the X-axis.

In FIG. 2B, layout diagram 206 further includes: via-to-gate/MD (VGD) patterns over corresponding ones of the gate patterns and the MD patterns; and conductive patterns which are designated for a first layer of metallization (M_1st patterns), extend in the direction of the X-axis, and are over corresponding ones of the VGD patterns, and thus over corresponding ones of the gate patterns and the MD patterns. FIG. 2B assumes a numbering convention in which the M_1st layer and a corresponding first layer of interconnection (VIA_1st layer) are referred to correspondingly as M0 and VIA0. In some embodiments, the numbering convention assumes that the M_1st layer and the V_1st layer are referred to correspondingly as M1 and VIA1. In each of layout diagrams 206 and 208C, relative to the Y-axis: the M0 patterns are non-overlapping of each other; and one M0 pattern correspondingly overlaps one AA pattern.

In FIG. 2B, layout diagram 206 further includes: buried contact-to-transistor-component patterns (BVD patterns) 220(1), 220(2), 220(3) and 220(4) which are arranged under corresponding portions of corresponding ones of the AA patterns; and buried conductive patterns 222(1), 222(2) and 222(3) which are designated for a first buried layer of metallization (BM0 patterns), extend in the direction of the X-axis, are under corresponding ones of BVD patterns 222(1)-222(4). Each of BM0 patterns 222(1) and 222(3) is designated to provide VDD. BM0 pattern 222(2) is designated to provide VSS. Accordingly, in some embodiments, BM0 patterns 222(1)-220(3) are referred to as power grid (PG) patterns. In some embodiments, each of BM0 patterns 222(1)-222(3) is referred to as a buried power rail. In some embodiments, each of BM0 patterns 222(1)-222(3) is referred to as a backside power rail.

In some embodiments, there are one or more additional BM0 patterns (not shown), e.g., routing patterns. Relative to the Y-axis, corresponding sizes of BM0 patterns 222(1)-222(3) are substantially larger than a size of a BM0 routing pattern (not shown). As a first example, in some embodiments, relative to the Y-axis, where a size of a first gap between BM0 pattern 222(1) and 222(2) and/or a size of a second gap between BM0 pattern 222(2) and 222(3) is sufficiently large, then a first and/or second routing type BM0 pattern (not shown) (having a long axis extending in the direction of the X-axis) is inserted correspondingly in the first and/or second gap. In some embodiments, the first routing pattern transmits a signal which is correspondingly external to cell 204(1) across the region occupied by cell 204(1). In some embodiments, the second routing pattern transmits a signal which is correspondingly external to cell 204(2) across the region occupied by cell 204(2). As a second example, in some embodiments, routing-type M0 patterns 226(1) and 226(2) are relocated to the first buried layer of metallization as corresponding routing-type BM0 patterns (not shown), e.g., and interconnection patterns for coupling to the corresponding gate patterns are accordingly added.

In layout diagram 206, each of BVD patterns 220(1)-220(4) is rectangular with corresponding long axes which extend in the direction of the Y-axis. In some embodiments, one or more of the BVD patterns are substantially square (not shown). In some embodiments, relative to the X-axis, a width of each of BVD patterns 220(1)-220(4) is substantially the same as a width of each of the MD patterns.

Relative to the X-axis, a midline of each of cell boundaries 212(1) and 212(2) is substantially collinear with track T6. Also relative to the X-axis: a long axis of symmetry of each of BVD patterns 220(1)-220(2) is substantially centered on the midline of cell boundary 212(1); and a long axis of symmetry of each of BVD patterns 220(3)-220(4) is substantially centered on the midline of cell boundary 212(2). As such, a long axis of each of BVD patterns 220(1)-220(4) is substantially collinear with track T6. Also, track T6 represents an axis of mirror symmetry relative to the arrangement of the MD patterns. Track T6 represents an axis of mirror symmetry relative to the arrangement of the gate patterns. Overall, track T6 represents an axis of mirror symmetry relative to each of cells 204(1) and 204(2).

Relative to the Y-axis: BVD pattern 220(1) is substantially centered over an uppermost AA pattern in cell boundary 212(1); BVD pattern 220(2) is substantially centered over a lowermost AA pattern in cell boundary 212(1); BVD pattern 220(3) is substantially centered over an uppermost AA pattern in cell boundary 212(2); and BVD pattern 220(4) is substantially centered over a lowermost AA pattern in cell boundary 212(2). In some embodiments, relative to the Y-axis, a size of a smallest one of BM0 patterns 222(1)-222(3) is equal to or greater than about twice the size of an AA pattern.

According to another approach, a BM0 layer is not provided and instead some of the M0 patterns are used as power grid (PG) patterns and are designated to provide correspondingly VDD and VSS, and corresponding MD patterns are provided for coupling the M0 PG patterns to corresponding portions of the AA patterns and are aligned on track T6. However, where width is defined as being relative to a short axis of a metallization pattern, the width of the M0 PG patterns according to the other approach is substantially the same as the width of M0 routing patterns. By moving the PG patterns to the BM0 layer, at least some embodiments provide PG patterns that are relatively wider than (and so suffer significantly smaller resistive (Ohmic) losses than) the M0 PG patterns according to the other approach. In addition, by moving the PG patterns to the BM0 layer, at least some embodiments suffer reduced routing congestion as compared to the other approach.

As noted, layout diagram 206 of FIG. 2B represents a first portion of memory devices 204(1) and 204(2) of FIG. 2A, and layout diagram 208C of FIG. 2C represents a second portion of memory cells 204(1) and 204(2). Layout diagram 206 includes layers from BM0 to M0. Layout diagram 208C includes layers from M0 to M2 (discussed below).

Recalling that layout diagram 208C represents a second portion of memory cells 204(1) and 204(2), the second portion corresponding to layers M0 through M2 in FIG. 2D, layout diagram 206 further includes: via patterns which are designated for a first layer of interconnection (VIA_1st layer), where the VIA_1st layer is the VIA0 layer in FIG. 2C and the patterns therein are VIA0 patterns, and which are over corresponding ones of the M0 patterns; conductive patterns which are designated for a second layer of metallization (M1 in FIG. 2C such that the patterns therein are M1 patterns), extend in the direction of the Y-axis, and are over corresponding ones of the VIA0 patterns; via patterns which are designated for a second layer of interconnection (VIA_2nd layer), where the VIA_2nd layer is the VIA1 layer in FIG. 2C and the patterns therein are VIA1 patterns, and which are over corresponding ones of the M0 patterns; and conductive patterns which are designated for a third layer of metallization (M2 in FIG. 2C such that the patterns therein are M2 patterns), extend in the direction of the X-axis, and are over corresponding ones of the VIA1 patterns. In layout diagram 208C, relative to the X-axis, the M1 patterns are non-overlapping of each other. Relative to the Y-axis: the M2 patterns are non-overlapping of each other.

In a stacked metallization architecture, which includes multiple layers of metallization such as in FIGS. 2B and 2C, a given electrical coupling path typically includes metallization patterns in multiple ones of the multiple layers. For most, if not all but one of the layers, the conductive segments have a long axis which is approximately the minimum permissible length for the corresponding metallization layer. However, for a few (and typically only one) of the metallization layers, the corresponding pattern for the given electrical coupling path has a long axis which is substantially longer than the minimum permissible length for the corresponding metallization layer. To simplify discussion, it will be assumed that only one layer has a corresponding pattern for the given electrical coupling path that has a long axis which is substantially longer than the minimum permissible length for the corresponding metallization layer, and that such a layer will be referred to as the long-line layer (or the rail layer) for the given electrical coupling path.

According to another approach, the long-line layer for each of the electrical coupling paths representing bit line BL and bit_bar line BLB is the M0 layer. For at least some embodiments, the long-line layer for each of the electrical coupling paths representing bit line BL and bit_bar line BLB of FIG. 2A is the M2 layer instead of the M0 layer, with the M2 layer being less congested in terms of routing than the M0 layer. As a result, short axes of the portions of the electrical coupling path in the M2 layer according to at least some embodiments are correspondingly wider than the short axes of the portions of the electrical coupling path in the M0 layer according to the other approach, Thus, according to at least some embodiments, the electrical coupling paths representing bit line BL and bit_bar line BLB suffer significantly smaller resistive (Ohmic) losses than the other approach.

FIG. 2D is a cross-section 214 of a semiconductor device, in accordance with at least some embodiments.

Cross-section 214 is for a device which corresponds to layout diagrams 206 of FIG. 2B and 208C of FIG. 2C, and more particularly to the cut-line IID-IID' in each of FIGS. 2B and 2C.

Layers in cross-section 214 include: a buried M0 (BM0) layer which includes a conductive segment 222(1)'; a buried VD (BVD) layer which includes a BVD structure 220(1)'; an active region layer which includes an active region AR(1); an MD/MG layer which includes gate conductors G1, G2 and G3, and MD contact structures MD(1) and MD(2); a VGD layer including a VGD structures VGD(1) and VGD (2); an M0 layer including a conductive segment M0(1) and M0(2); a VIA0 layer; an M1 layer which includes a conductive segment M1(1); a VIA1 layer; and an M2 layer which includes a conductive segment M2(1).

As noted above, no MD patterns are aligned on track T6 in layout diagram 206 of FIG. 2B, whereas the other approach provides MD patterns which are for coupling to the M0 PG patterns and which are aligned with track T6. The absence of MD patterns aligned to track T6 in layout diagram 206 of FIG. 2B is reflected by a 'ghostMD' shape (having dashed boundary lines) in the MD/MG layer of FIG. 2D. The ghostMD shape indicates that an MD structure otherwise would be present according to the other approach but (again) is not present in cross-section 214 because corresponding MD patterns are not aligned to track T6 in layout diagram 206 of FIG. 2B.

Figure 2E:
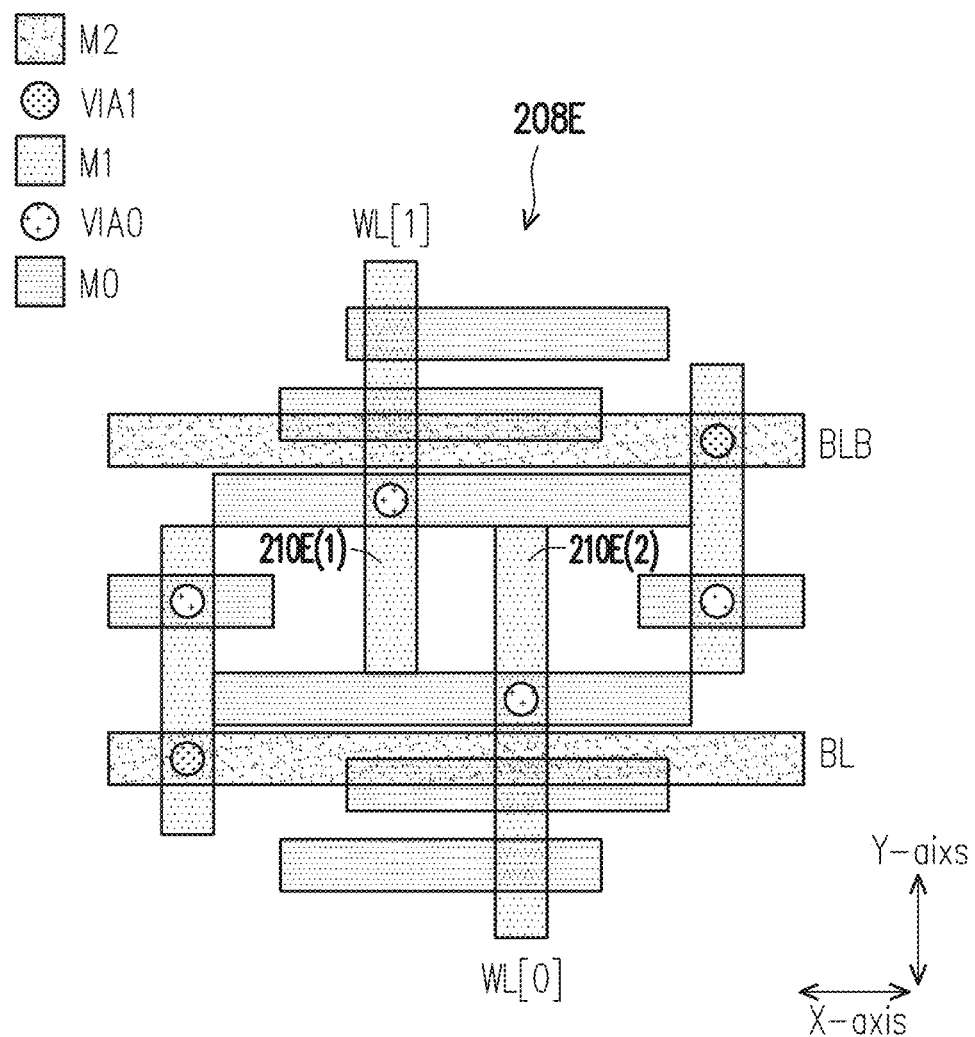

FIG. 2E is a layout diagram 208E, in accordance with some embodiments.

Layout diagram 208E is an alternative to layout diagram 208C. As such, layout diagram 208E of FIG. 2E represents a second portion of memory cells 204(1) and 204(2) where (again) the second portion corresponds to layers M0 through M2 in FIG. 2D. Layout diagram 208E includes layers from M0 to M2.

In layout diagram 208E, corresponding long axes of the M1 patterns representing write line WL[0] (M1 pattern WL[0]) and WL[1] (M1 pattern WL[1]) are reduced in length. In some embodiments, because of the reduced lengths of the M1 WL[0]) pattern and the M1 WL[1] pattern, each of the M1 WL[0]) pattern and the M1 WL[1] pattern are referred to as island patterns. As such, M1 pattern WL[0] does not overlap the M2 pattern representing the bit_bar line BLB, and M1 pattern WL[1] does not over the M2 pattern representing the bit line BL. A benefit of layout diagram 208E as compared to layout diagram 208C of FIG. 2C is that M2 patterns BL and BLB in layout diagram 208E exhibit lower bit line capacitance than corresponding M2 patterns BL and BLB in layout diagram 208C. In some embodiments, an island pattern represents a conductive segment which is less than, or substantially equal to albeit without being greater than, the Blech length, $L_{Blech}$. It is noted that $L_{Blech}$ represents a length of conductor below which substantially no electromigration occurs.

Figure 3A:
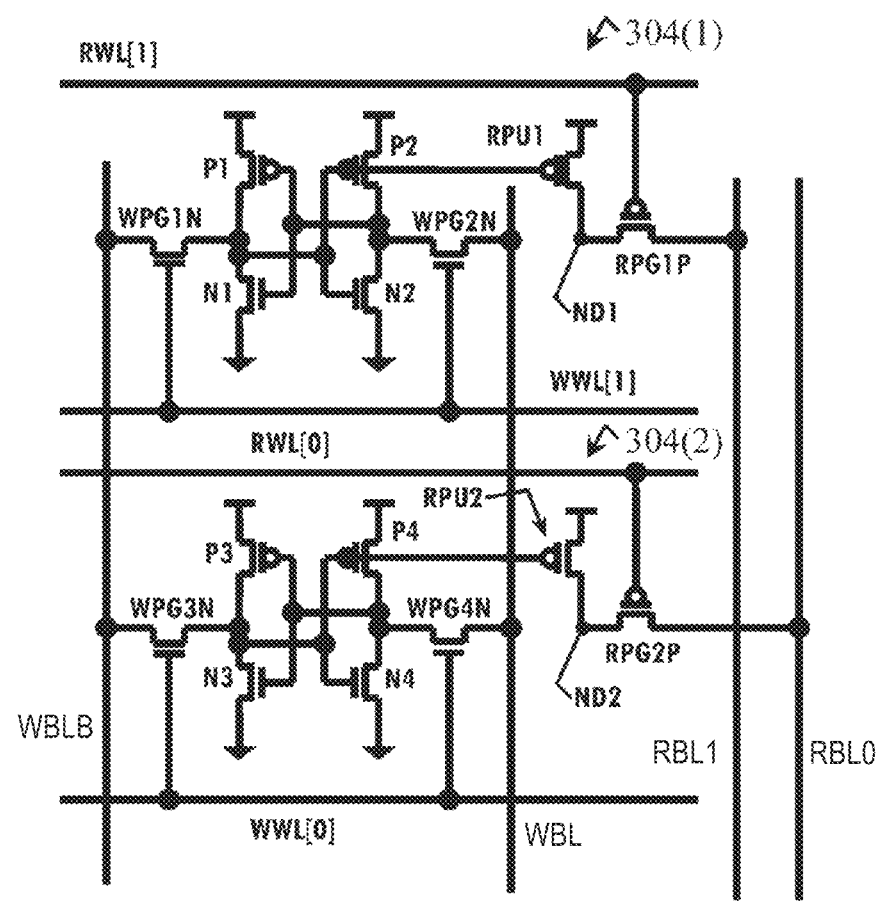
FIG. 3A is a circuit diagram, in accordance with some embodiments.
Figure 3B:
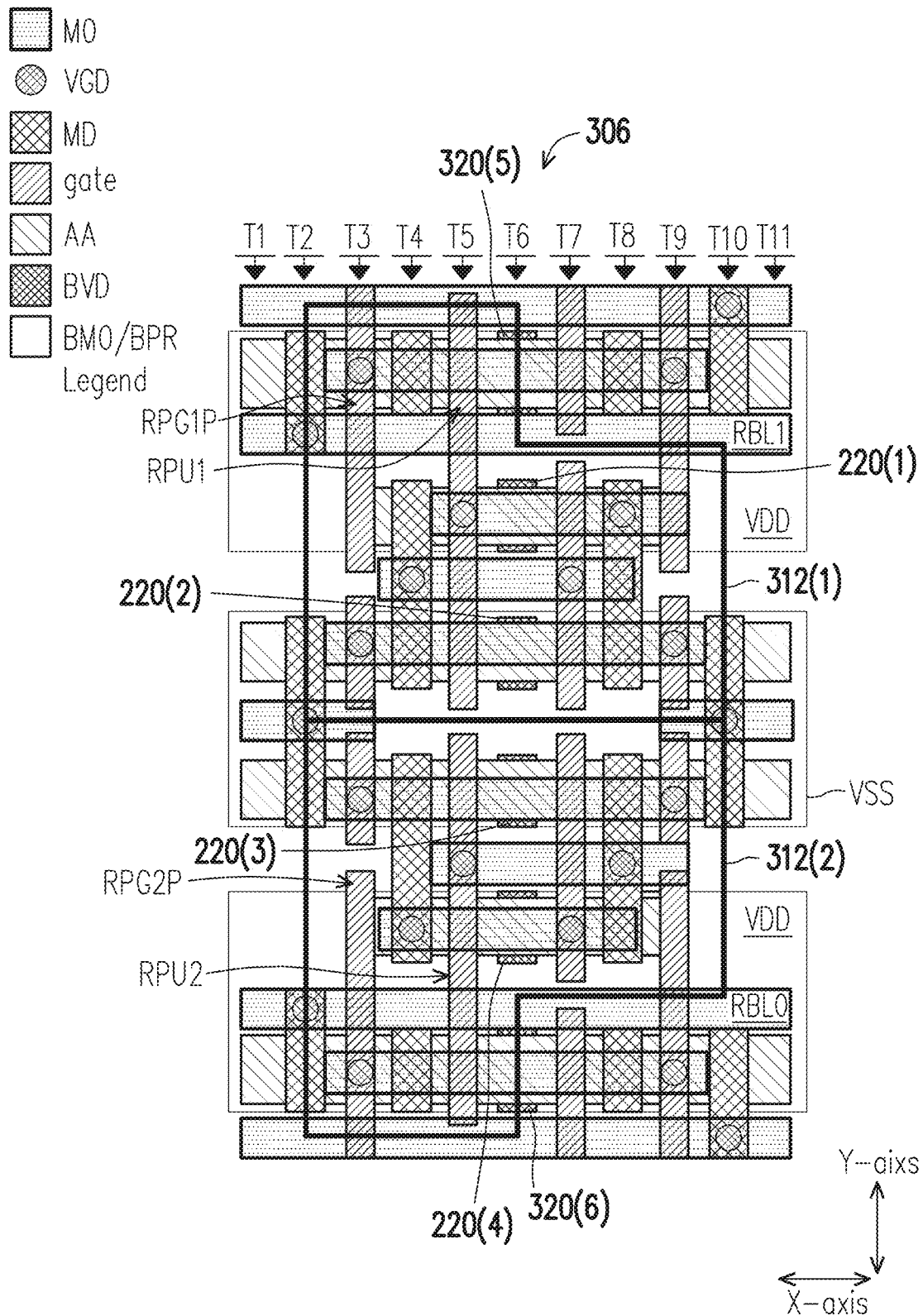
FIGS. 3B and 3C are corresponding layout diagrams, in accordance with some embodiments.
Figure 3C:
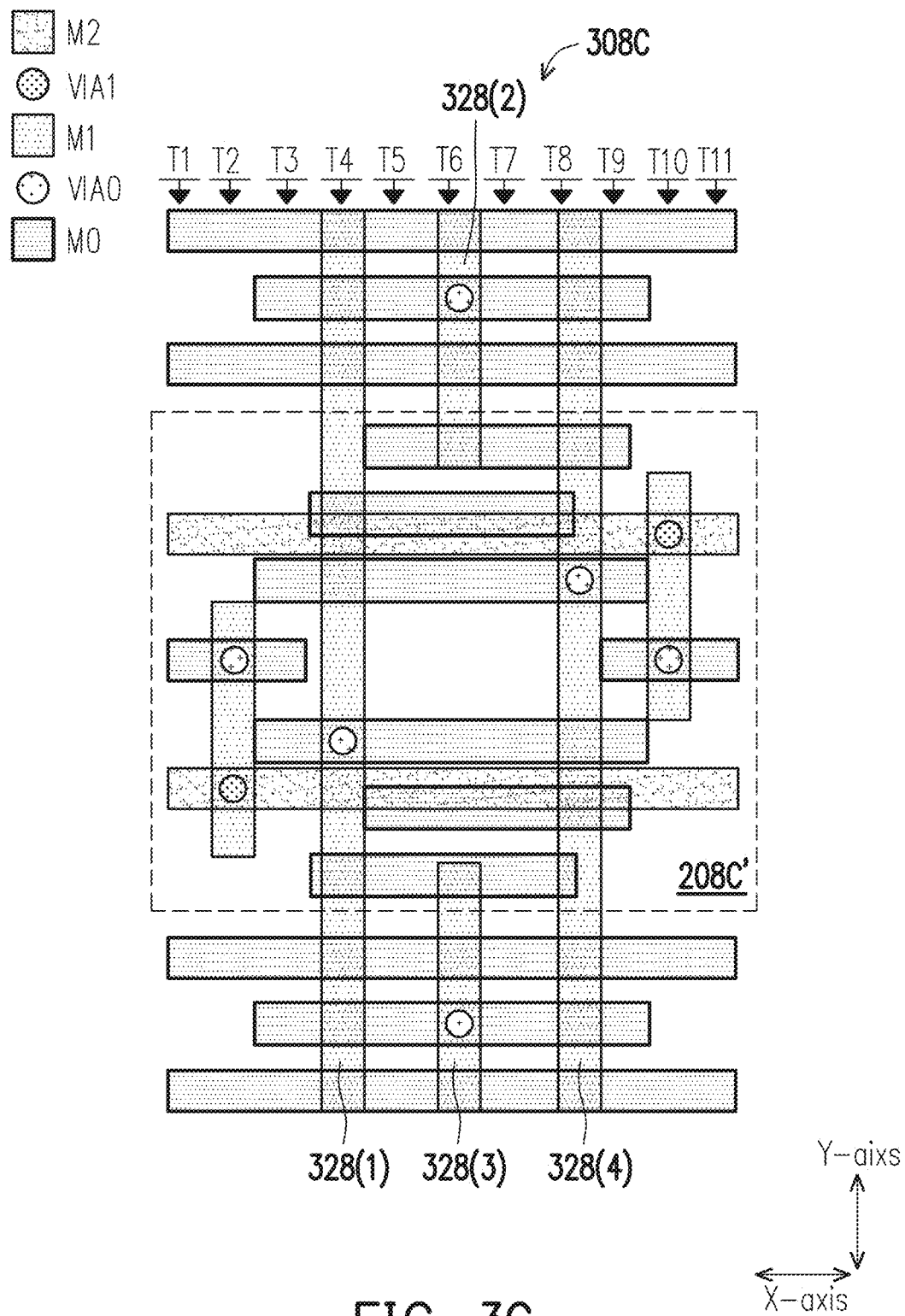

FIG. 3A is a circuit diagram of memory cells 304(1) and 304(2), in accordance with some embodiments. FIGS. 3B-3C are corresponding layout diagrams 306 and 308C, in accordance with some embodiments.

FIGS. 3A-3C follow a similar numbering scheme to that of FIGS. 2A-2E. Though corresponding, some components also differ. To help identify components which correspond but nevertheless have differences, the numbering convention uses 3-series numbers for FIGS. 3A-3C while the numbering convention for FIGS. 2A-2E uses 2-series numbers. For example, item 312(1) in FIG. 3B is a cell boundary and corresponding item 212(1) in FIG. 2B is a cell boundary, and wherein: similarities are reflected in the common root_12 (1); and differences are reflected in the corresponding leading digit 3 in FIG. 3B and 2 in FIG. 2B. For brevity, the discussion will focus more on differences between FIGS. 3A-3C and FIGS. 2A-2E than on similarities.

Whereas each of memory cells 204(1) and 204(2) of FIG. 2A is a 6T1P type of memory cell, each of memory cells 304(1) and 304(2) in FIG. 3A is an eight transistor (8T), dual port (2P) type of memory cell (8T2P memory cell).

Whereas layout diagram 206 of FIG. 2B includes four BVD patterns, layout diagram 306 of FIG. 3B includes six BVD patterns. More particularly, in addition to BVD patterns 220(1)-220(4), layout diagram 306 further includes BVD patterns 320(5) and 320(6). Similar to each of BVD patterns 220(1)-220(4), a long axis of each of BVD patterns 320(5)-320(6) is substantially collinear with track T6. Nevertheless, each of cell boundaries 312(1) and 312(2) has a width of four contacted poly pitch (4 CPP) relative to the X-axis. Also, track T6 represents an axis of mirror symmetry relative to the arrangement of the MD patterns.

As compared to memory cell 204(1) of FIG. 2A, memory cell 304(1) of FIG. 3A further includes: a PMOS pull-up transistor RPU1 coupled between VDD and a node ND1; a PMOS read pass gate transistor RPG1P coupled between node ND1 and a first read bit line (RBL1); a PMOS pull-up transistor RPU2 coupled between VDD and a node ND2; and a PMOS read pass gate transistor RPG2P coupled between node ND1 and a first read bit line (RBL1).

Gate electrodes of transistors P2, N2 and RPU1, and drain electrodes of transistors P1 and N1, are coupled together. Gate electrodes of transistors P4, N4 and RPU2, and drain electrodes of transistors P3 and N3, are coupled together. Gate electrodes of transistors RPG1P and RPG2P are coupled correspondingly to read word lines RWL[1]and RWL[0]. Whereas bit line BL and bit_bar line BLB are shared in FIG. 2A, neither RBL1 nor RBL0 is shared in FIG. 3A.

Layout diagram 306 of FIG. 3B includes layers from BM0 to M0. Layout diagram 308C of FIG. 3C includes layers from M0 to M2.

In FIG. 3C, layout diagram 308C represents an expansion of layout diagram 208C, e.g., in terms of additional patterns. At least some of the addition patterns are the patterns in layout diagram 308C which are outside the dashed box which has been called out as item number 208C'. More particularly, relative to the Y-axis: three instances of M0 patterns have been added above box 208C'; three instances of M0 patterns have been added below box 208C'; M1 patterns 328(1), 328(2), and 328(4) have been extended above box 208C'; M1 patterns 328(1), 329(30 and 328(4) have been extended below box 208C'; a VIA0 pattern has been added above box 208C' which is overlapped by M1 pattern 328(2); and a VIA0 pattern has been added below box 208C' which is overlapped by M1 pattern 328(3). Also, in box 208C', the position has been changed of the VIA0 pattern overlapped by M1 pattern 328(1), and the position has been changed of the VIA0 pattern overlapped by M1 pattern 328(4).

Figure 4A:
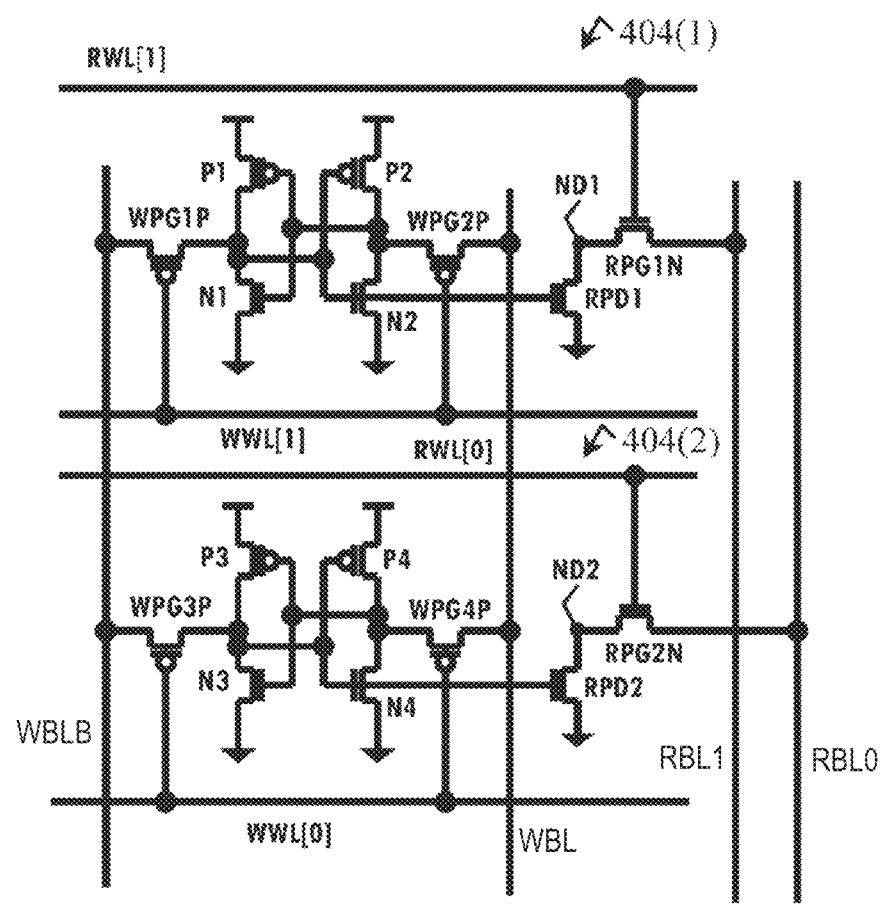
FIG. 4A is a circuit diagram, in accordance with some embodiments.
Figure 4B:
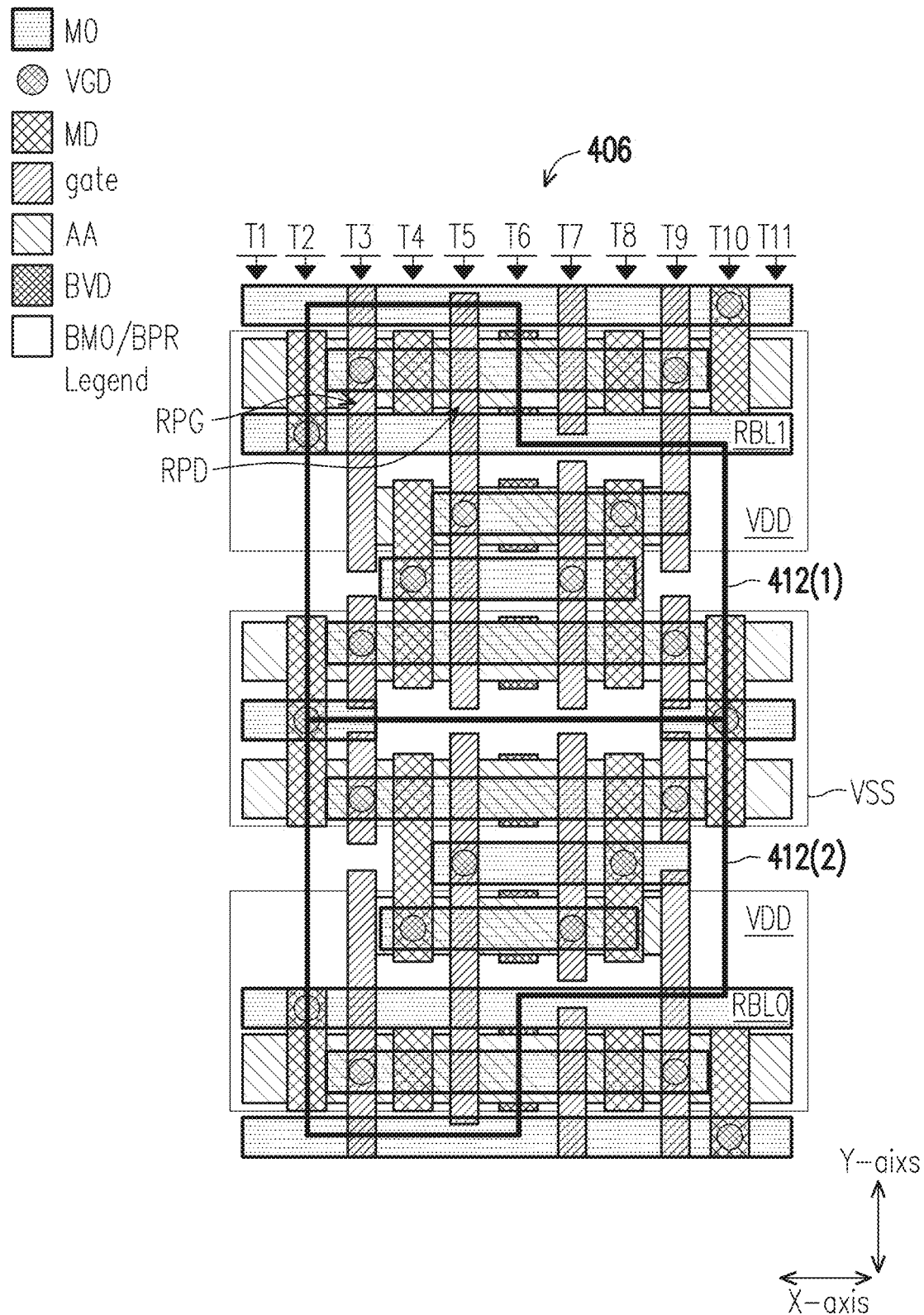
FIG. 4B is a layout diagram, in accordance with some embodiments.

FIG. 4A is a circuit diagram of memory cells 404(1) and 404(2), in accordance with some embodiments. FIG. 4B is a layout diagram 406, in accordance with some embodiments.

FIGS. 4A-4B follow a similar numbering scheme to that of FIGS. 3A-3C. Though corresponding, some components also differ. To help identify components which correspond but nevertheless have differences, the numbering convention uses 4-series numbers for FIGS. 4A-4B while the numbering convention for FIGS. 3A-3C uses 3-series numbers. For example, item 412(1) in FIG. 4B is a cell boundary and corresponding item 312(1) in FIG. 3B is a cell boundary, and wherein: similarities are reflected in the common root_12 (1); and differences are reflected in the corresponding leading digit 4 in FIG. 4B and 3 in FIG. 3B. For brevity, the discussion will focus more on differences between FIGS. 4A-4B and FIGS. 3A-3C than on similarities.

Whereas write pass gates WPG1N-WPG4N are NMOS in FIG. 3A, corresponding write pass gates WPG1P, WPG2P, WPG3P and WPG4P are PMOS in FIG. 4A.

Whereas read pass gates RPG1P and RPG2P are PMOS in FIG. 3A, read pass gates RPG1N and RPG2N are NMOS in FIG. 4A.

Whereas FIG. 3A has pull-up transistors RPU1 and RPD2 which are PMOS and which are correspondingly coupled to nodes ND1 and ND2, FIG. 4A instead has pull-down transistors RPD1 and RPD2. Pull-down transistors RPD1 and RPD2 are NMOS. Pull-down transistor RPD1 is coupled between node ND1 and VSS. Pull-down transistor RPD2 is coupled between node ND2 and VSS. A long axis of each of the BVD patterns is substantially collinear with track T6.

Layout diagram 406 of FIG. 3B includes layers from BM0 to M0. A corresponding layout diagram for layers M0 to M2 is represented by layout diagram 308C of FIG. 3C.

Figure 5A:
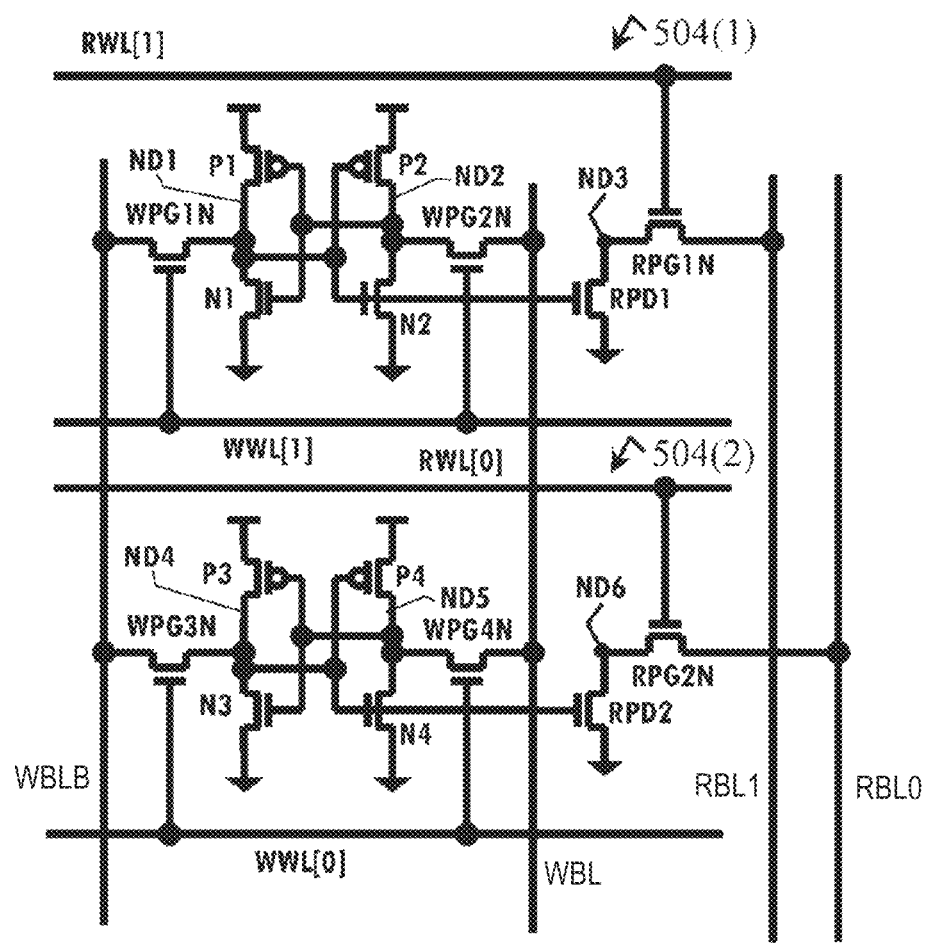
FIG. 5A is a circuit diagram, in accordance with some embodiments.
Figure 5B:
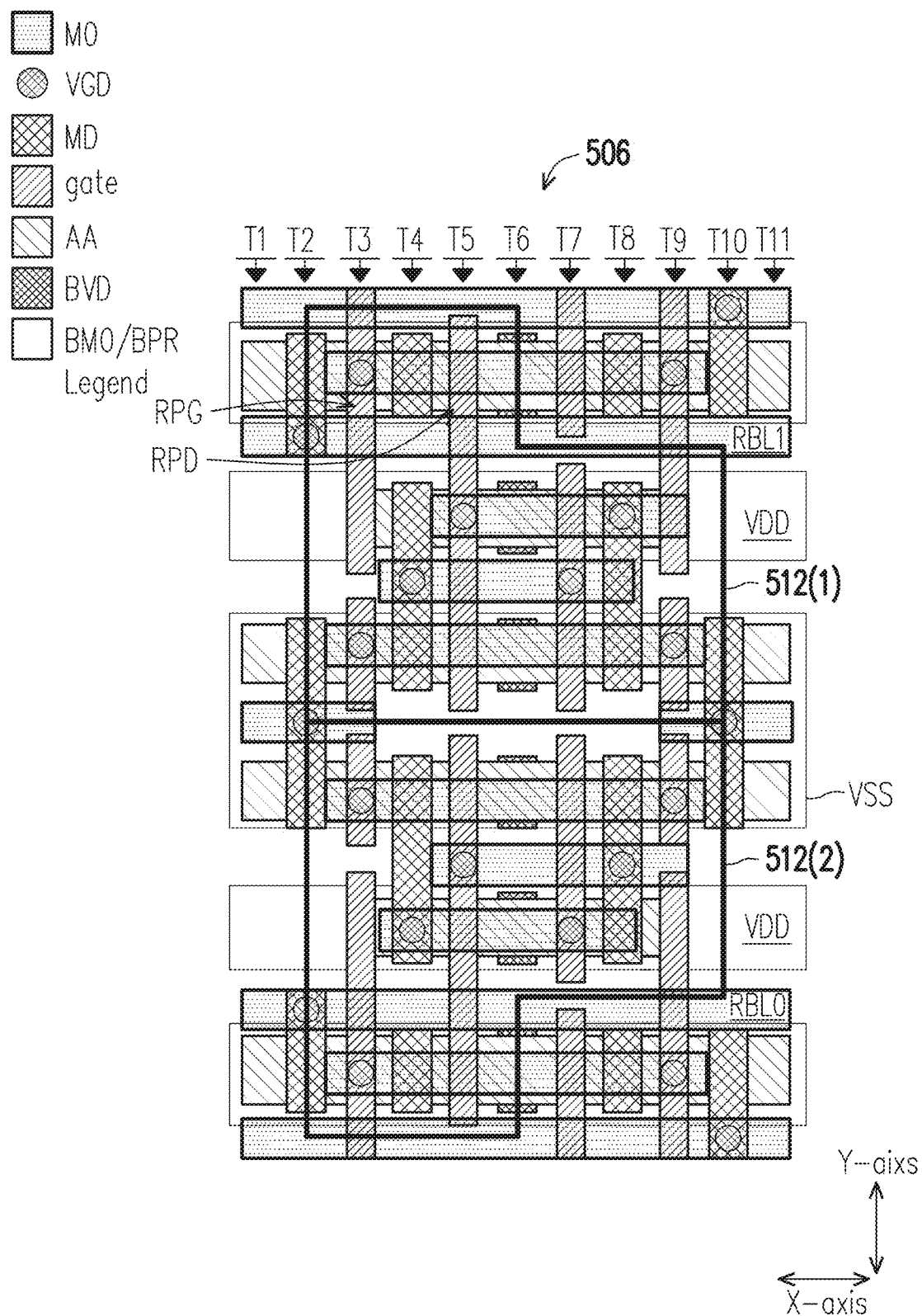
FIG. 5B is a layout diagram, in accordance with some embodiments.

FIG. 5A is a circuit diagram of memory cells 504(1) and 504(2), in accordance with some embodiments. FIG. 5B is a layout diagram 506, in accordance with some embodiments.

FIGS. 5A-5B follow a similar numbering scheme to that of FIGS. 4A-4B. Though corresponding, some components also differ. To help identify components which correspond but nevertheless have differences, the numbering convention uses 5-series numbers for FIGS. 5A-5B while the numbering convention for FIGS. 4A-4B uses 4-series numbers. For example, item 512(1) in FIG. 5B is a cell boundary and corresponding item 412(1) in FIG. 4B is a cell boundary, and wherein: similarities are reflected in the common root_12 (1); and differences are reflected in the corresponding leading digit 5 in FIG. 5B and 4 in FIG. 4B. For brevity, the discussion will focus more on differences between FIGS. 5A-5B and FIGS. 4A-4C than on similarities.

Whereas write pass gates WPG1P WPG4P are PMOS in FIG. 4A, corresponding write pass gates WPG1N, WPG2N, WPG3N and WPG4N are NMOS in FIG. 5A. Layout diagram 506 of FIG. 5B includes layers from BM0 to M0. A corresponding layout diagram for layers M0 to M2 is represented by layout diagram 308C of FIG. 3C. Nevertheless, each of cell boundaries 612(1) and 612(2) has a width of four contacted poly pitch (4 CPP) relative to the X-axis. A long axis of each of the BVD patterns is substantially collinear with track T6.

Figure 6A:
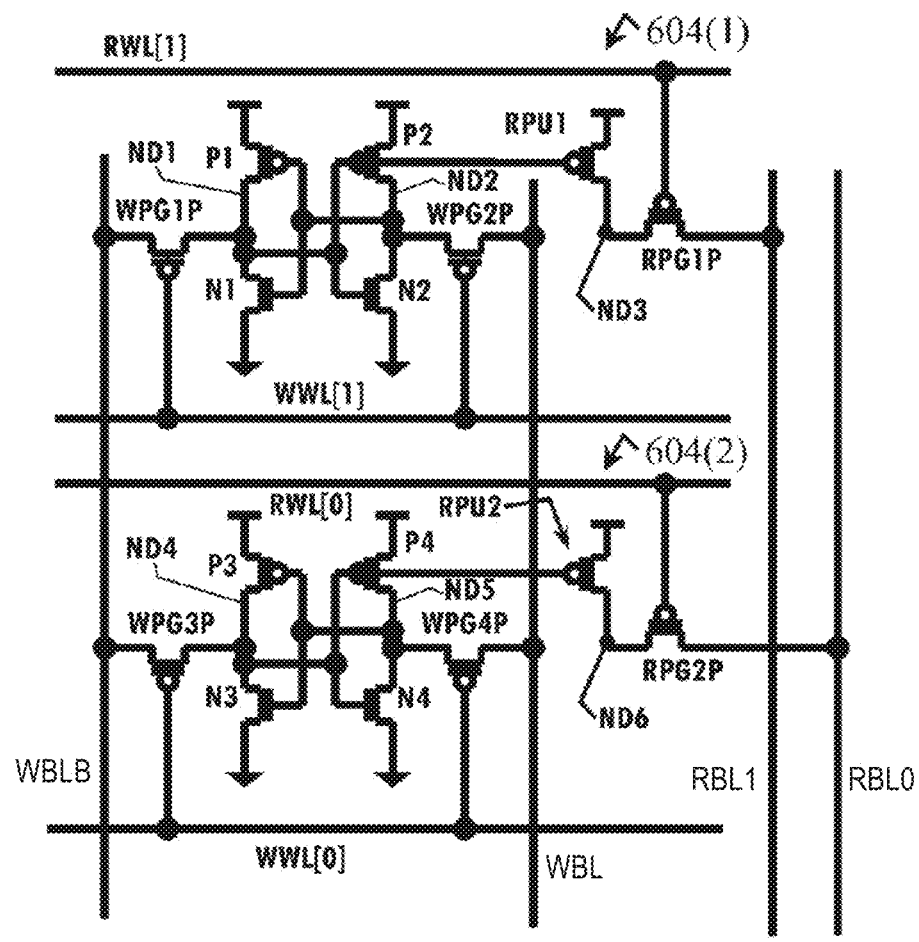
FIG. 6A is a circuit diagram, in accordance with some embodiments.
Figure 6B:
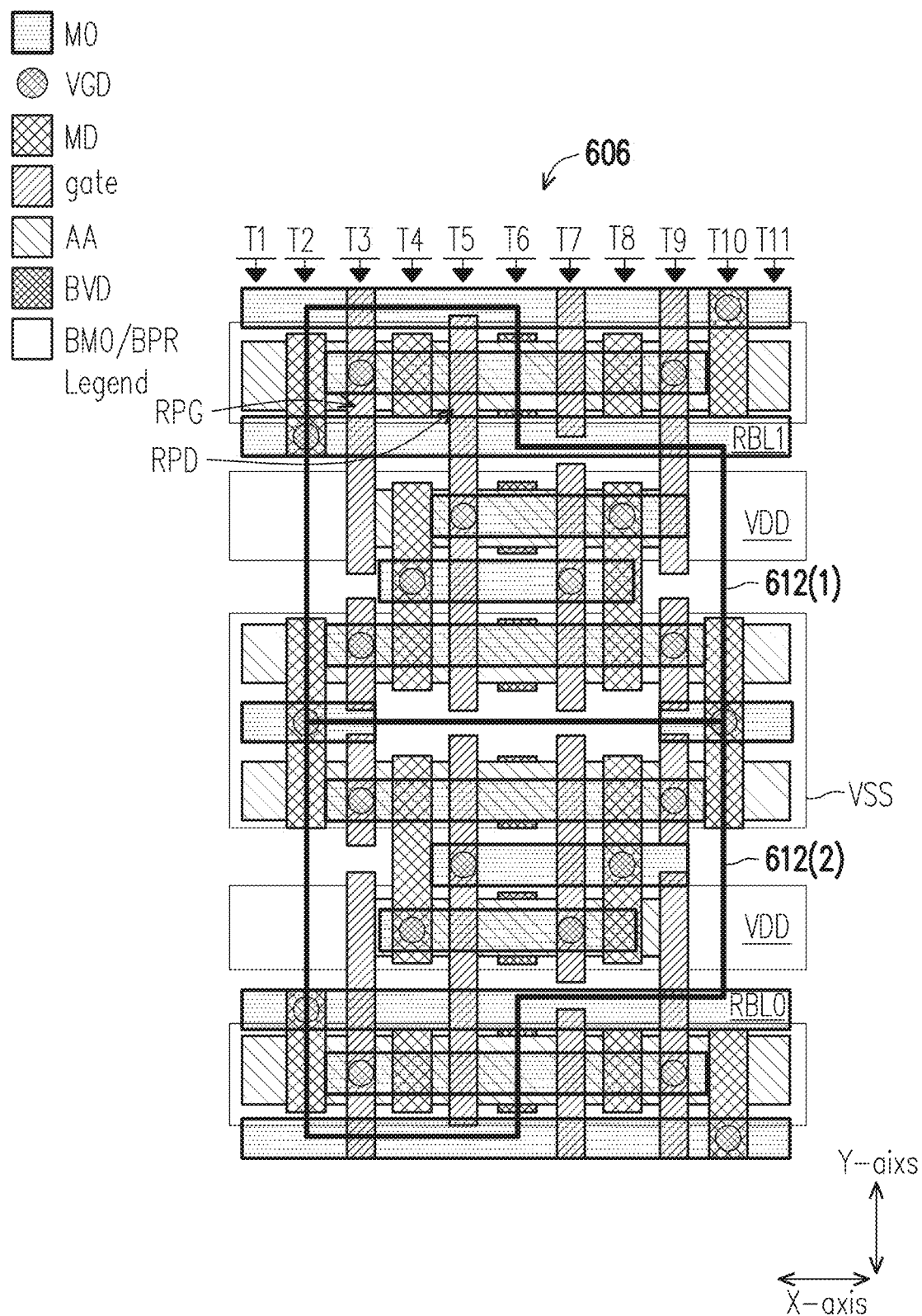
FIG. 6B is a layout diagram, in accordance with some embodiments.

FIG. 6A is a circuit diagram of memory cells 604(1) and 604(2), in accordance with some embodiments. FIG. 6B is a layout diagram 606, in accordance with some embodiments.

FIGS. 6A-6B follow a similar numbering scheme to that of FIGS. 5A-5B. Though corresponding, some components also differ. To help identify components which correspond but nevertheless have differences, the numbering convention uses 6-series numbers for FIGS. 6A-6B while the numbering convention for FIGS. 5A-5B uses 5-series numbers. For example, item 612(1) in FIG. 6B is a cell boundary and corresponding item 512(1) in FIG. 5B is a cell boundary, and wherein: similarities are reflected in the common root_12 (1); and differences are reflected in the corresponding leading digit 6 in FIG. 6B and 5 in FIG. 5B. For brevity, the discussion will focus more on differences between FIGS. 6A-6B and FIGS. 5A-5C than on similarities.

Whereas write pass gates WPG1N WPG4N are NMOS in FIG. 5A, corresponding write pass gates WPG1P, WPG2P, WPG3P and WPG4P are PMOS in FIG. 6A. Whereas read pass gates RPG1N and RPG2N are NMOS in FIG. 5A, corresponding read pass gates RPG1P and RPG2P are PMOS in FIG. 6A. Whereas FIG. 5A uses pull-down transistors RPD1 and RPD2 which are NMOS, FIG. 6A uses pull-up transistors RPU1 and RPD2 which are PMOS (see FIG. 3A). Nevertheless, each of cell boundaries 612(1) and 612(2) has a width of four contacted poly pitch (4 CPP) relative to the X-axis. A long axis of each of the BVD patterns is substantially collinear with track T6.

Layout diagram 606 of FIG. 6B includes layers from BM0 to M0. A corresponding layout diagram for layers M0 to M2 is represented by layout diagram 308C of FIG. 3C.

Figure 7A:
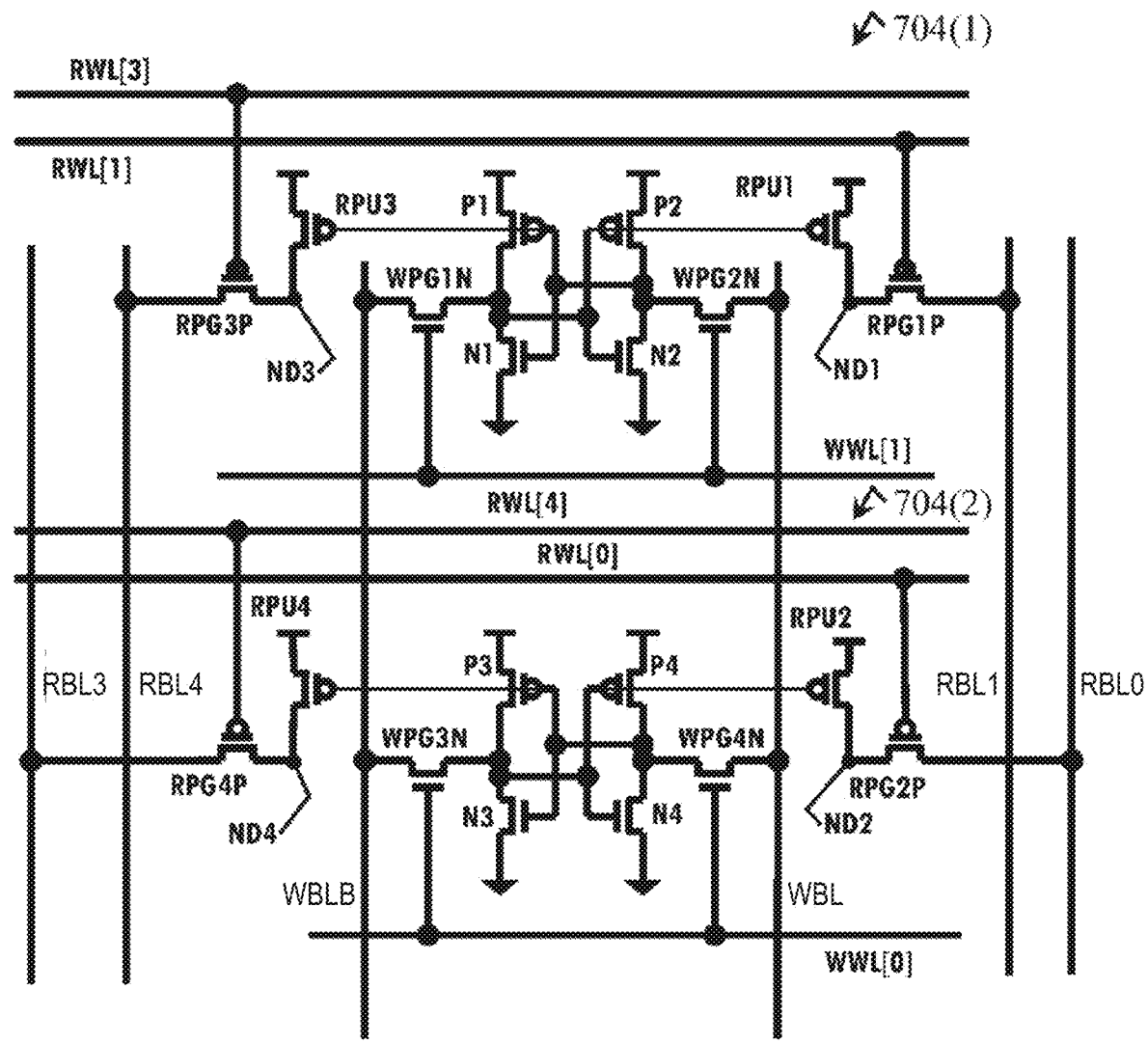
FIG. 7A is a circuit diagram, in accordance with some embodiments.
Figure 7B:
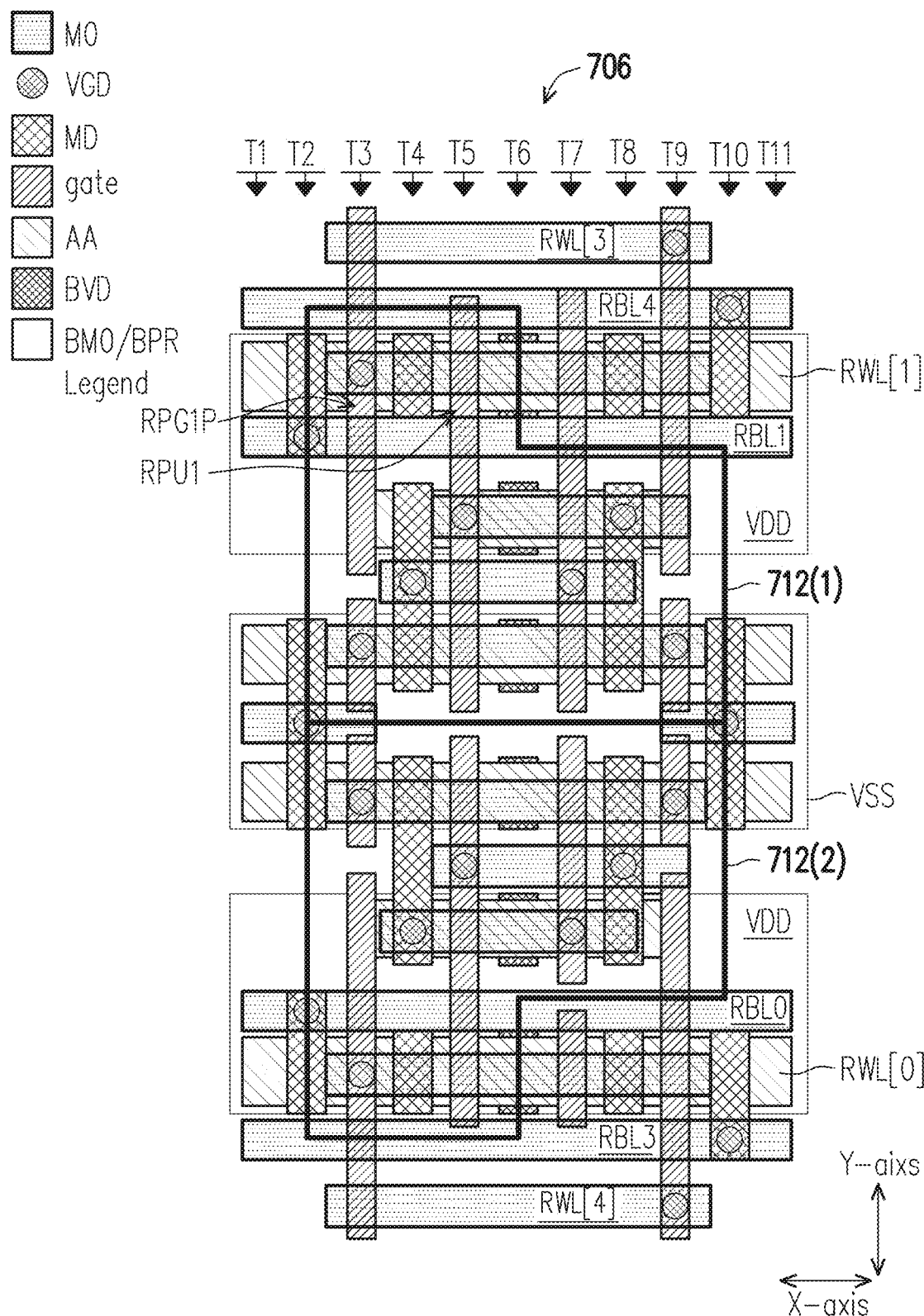
FIG. 7B is a layout diagram, in accordance with some embodiments.

FIG. 7A is a circuit diagram of memory cells 704(1) and 704(2), in accordance with some embodiments. FIG. 7B is layout diagram 706, in accordance with some embodiments.

FIGS. 7A-7B follow a similar numbering scheme to that of FIGS. 3A-3B. Though corresponding, some components also differ. To help identify components which correspond but nevertheless have differences, the numbering convention uses 7-series numbers for FIGS. 7A-7B while the numbering convention for FIGS. 3A-3B uses 3-series numbers. For example, item 712(1) in FIG. 7B is a cell boundary and corresponding item 312(1) in FIG. 3B is a cell boundary, and wherein: similarities are reflected in the common root_12 (1); and differences are reflected in the corresponding leading digit 7 in FIG. 7B and 3 in FIG. 3B. For brevity, the discussion will focus more on differences between FIGS. 7A-7B and FIGS. 3A-3B than on similarities.

Whereas each of memory cells 304(1) and 304(2) of FIG. 3A is an 8T2P type of memory cell, each of memory cells 704(1) and 704(2) in FIG. 7A is ten transistor (10T), triple port (3P) type of memory cell (10T3P memory cell).

Whereas layout diagram 206 of FIG. 2B includes four BVD patterns, layout diagram 706 of FIG. 7B includes six BVD patterns. A long axis of each of the BVD patterns is substantially collinear with track T6. Track T6 is an axis of mirror symmetry for each of the BVD patterns. Nevertheless, each of cell boundaries 712(1) and 712(2) has a width of four contacted poly pitch (4 CPP) relative to the X-axis.

As compared to memory cell 304(1) of FIG. 3A, memory cell 704(1) of FIG. 7A further includes: a PMOS pull-up transistor RPU3 coupled between VDD and a node ND3; a PMOS read pass gate transistor RPG3P coupled between node ND3 and a read bit line RBL4; a PMOS pull-up transistor RPU4 coupled between VDD and a node ND4; and a PMOS read pass gate transistor RPG4P coupled between node ND4 and a read bit line RBL3. Nevertheless, each of cell boundaries 712(1) and 712(2) has a width of four contacted poly pitch (4 CPP) relative to the X-axis.

Gate electrodes of transistors P1, N1 and RPU3, and drain electrodes of transistors P1 and N1, are coupled together. Gate electrodes of transistors P3, N3 and RPU4, and drain electrodes of transistors P4 and N4, are coupled together. Gate electrodes of transistors RPG3P and RPG4P are coupled correspondingly to read word lines RWL[3]and RWL[4]. Whereas bit line BL and bit_bar line BLB are shared in FIG. 2A, neither RBL3 nor RBL4 is shared in FIG. 7A.

Layout diagram 706 of FIG. 7B includes layers from BM0 to M0.

Figure 8:
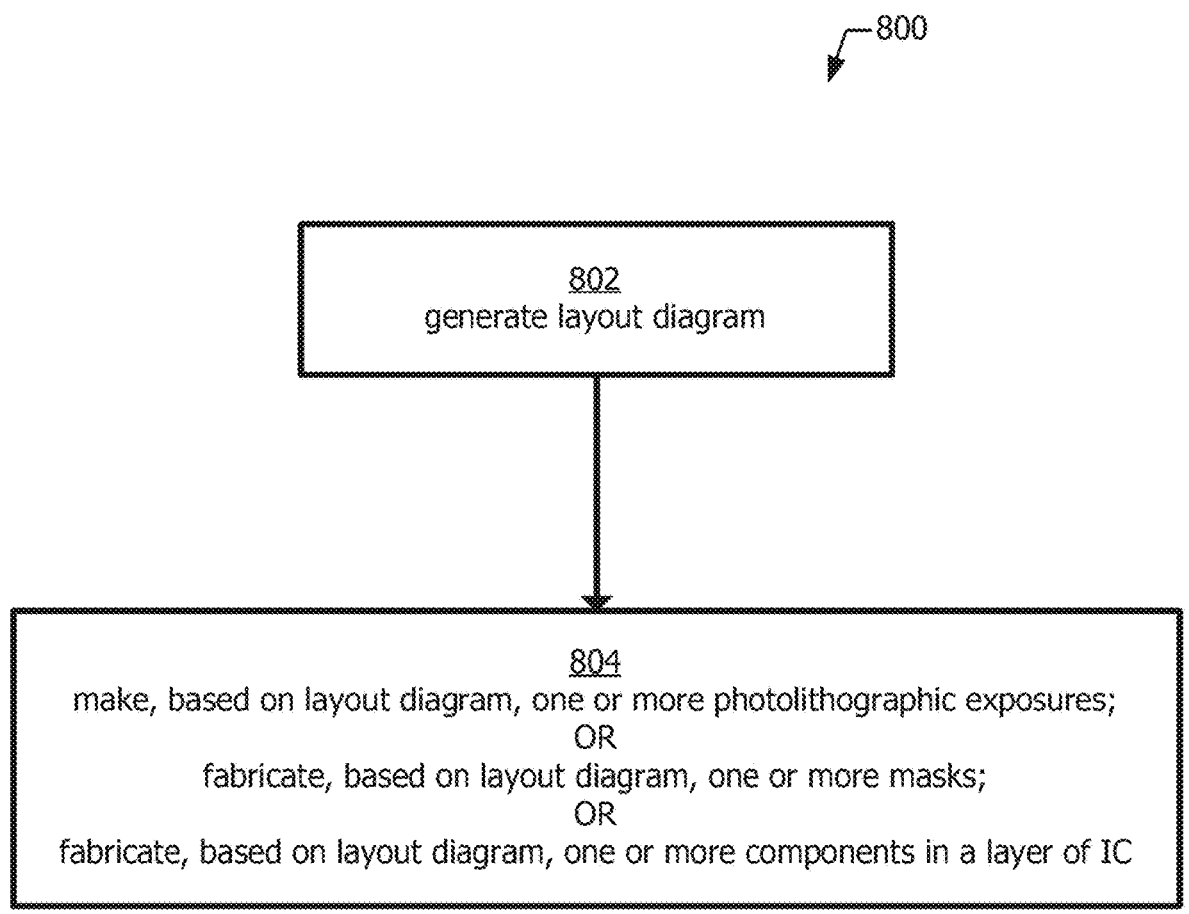
FIGS. 8-9 are corresponding flowcharts, in accordance with some embodiments.

FIG. 8 is a flowchart of a method 800 of manufacturing a semiconductor device, in accordance with some embodiments.

Method 800 is implementable, for example, using EDA system 1000 (FIG. 10, discussed below) and an integrated circuit (IC), manufacturing system 1100 (FIG. 11, discussed below), in accordance with some embodiments. Examples of a semiconductor device which can be manufactured according to method 800 include semiconductor device 100 FIG. 1.

In FIG. 8, method 800 includes blocks 802-804. At block 802, a layout diagram is generated which, among other things, includes one or more of layout diagrams disclosed herein, or the like. Block 802 is implementable, for example, using EDA system 1000 (FIG. 10, discussed below), in accordance with some embodiments. From block 802, flow proceeds to block 804.

At block 804, based on the layout diagram, at least one of (A) one or more photolithographic exposures are made or (B) one or more semiconductor masks are fabricated or (C) one or more components in a layer of a semiconductor device are fabricated. See discussion below of FIG. 11.

Figure 9:
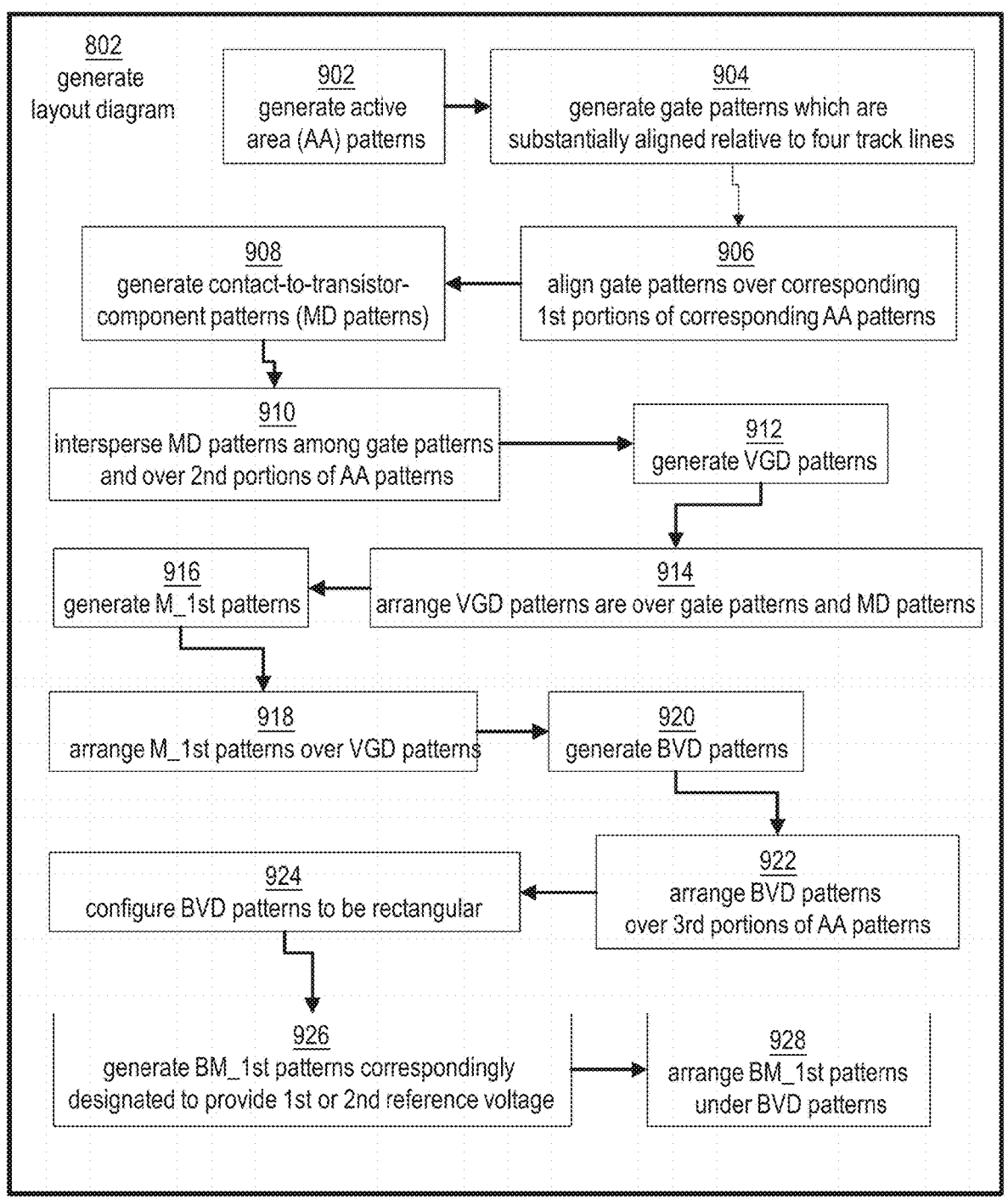

FIG. 9 is a flowchart of a method of generating a layout diagram, in accordance with some embodiments.

More particularly, the flowchart of FIG. 9 shows additional blocks included in block 802 of FIG. 8, in accordance with one or more embodiments.

In FIG. 9, the flowchart includes blocks 902-928. At block 902, active area (AA) patterns are generated. Examples of AA patterns are shown in FIG. 2B. From block 902, flow proceeds to block 904.

At block 904, gate patterns are generated which are substantially aligned with four track lines. Examples of the gate patterns are shown in FIG. 2B, which are correspondingly aligned with track lines T3, T5, T7 and T9 in FIG. 2B. A benefit of aligning the gate patterns correspondingly with four track lines is that the corresponding cell boundary has a width of four contacted poly pitch (4 CPP) relative to the X-axis. Examples of 4 CPP wide boundaries are boundaries 212(1) and 212(2) of FIG. 2B. From block 904, flow proceeds to block 906.

At block 906, the gate patterns are aligned over corresponding first portions of corresponding ones of the AA patterns. Examples of aligning the gate patterns over corresponding first portions of corresponding ones of the AA patterns are shown in FIG. 2B. From block 906, flow proceeds to block 908.

At block 908, contact-to-transistor-component patterns (MD patterns) are generated. Examples of MD patterns are shown in FIG. 2B. From block 908, flow proceeds to block 910.

At block 910, the MD patterns are interspersed among the gate patterns and over corresponding second portions of corresponding ones of the AA patterns. Examples of aligning the MD patterns over corresponding second portions of corresponding ones of the AA patterns are shown in FIG. 2B. From block 910, flow proceeds to block 912.

At block 912, VGD patterns are generated. Examples of the VGD patterns are shown in FIG. 2B. From block 912, flow proceeds to block 914.

At block 914, the VGD patterns are arranged over corresponding ones of the gate patterns and the MD patterns. An example of an arrangement of VGD patterns arranged over corresponding ones of the gate patterns and the MD pattern is the arrangement of VGD patterns in FIG. 2B. From block 914, flow proceeds to block 916.

At block 916, M_1st patterns are generated. Examples of the M_1st patterns are the M0 patterns in FIG. 2B. From block 916, flow proceeds to block 918.

At block 918, the M_1st patterns are arranged over corresponding ones of the VGD patterns. An example of an arrangement of M_1st patterns over corresponding ones of the VGD patterns is the arrangement of M0 patterns over corresponding VGD patterns in FIG. 2B. From block 918, flow proceeds to block 920.

At block 920, BVD patterns are generated. Examples of the BVD patterns are BVD patterns 220(1)-220(4) of FIG. 2B. From block 920, flow proceeds to block 922.

At block 922, the BVD patterns are arranged over corresponding third portions of corresponding ones of the AA patterns. An example of an arrangement of BVD patterns over corresponding third portions of corresponding ones of the AA patterns is the arrangement of BVD patterns 220(1)-220(4) in FIG. 2B. From block 922, flow proceeds to block 924.

At block 924, the BVD patterns are configured to be rectangular. Examples of rectangular BVD patterns are BVD patterns 220(1)-220(4) of FIG. 2B whose long axes extend in the direction of the Y-axis. From block 924, flow proceeds to block 926.

At block 926, BM_1st patterns are generated which are correspondingly designated to provide a first or second reference voltage. Examples of BM_1st patterns which are correspondingly designated to provide a first or second reference voltage are BM0 patterns 222(1) and 222(3) of FIG. 2B which are designated to provide VDD, and BM0 pattern 222(2) of FIG. 2B which is designated to provide VSS. From block 926, flow proceeds to block 928.

At block 928, the BM_1st patterns are arranged under corresponding ones of the BVD patterns. An example of an arrangement of BM_1st patterns under corresponding ones of the BVD patterns is the arrangement of BM0 patterns 222(1)-222(3) in FIG. 2B.

Figure 10:
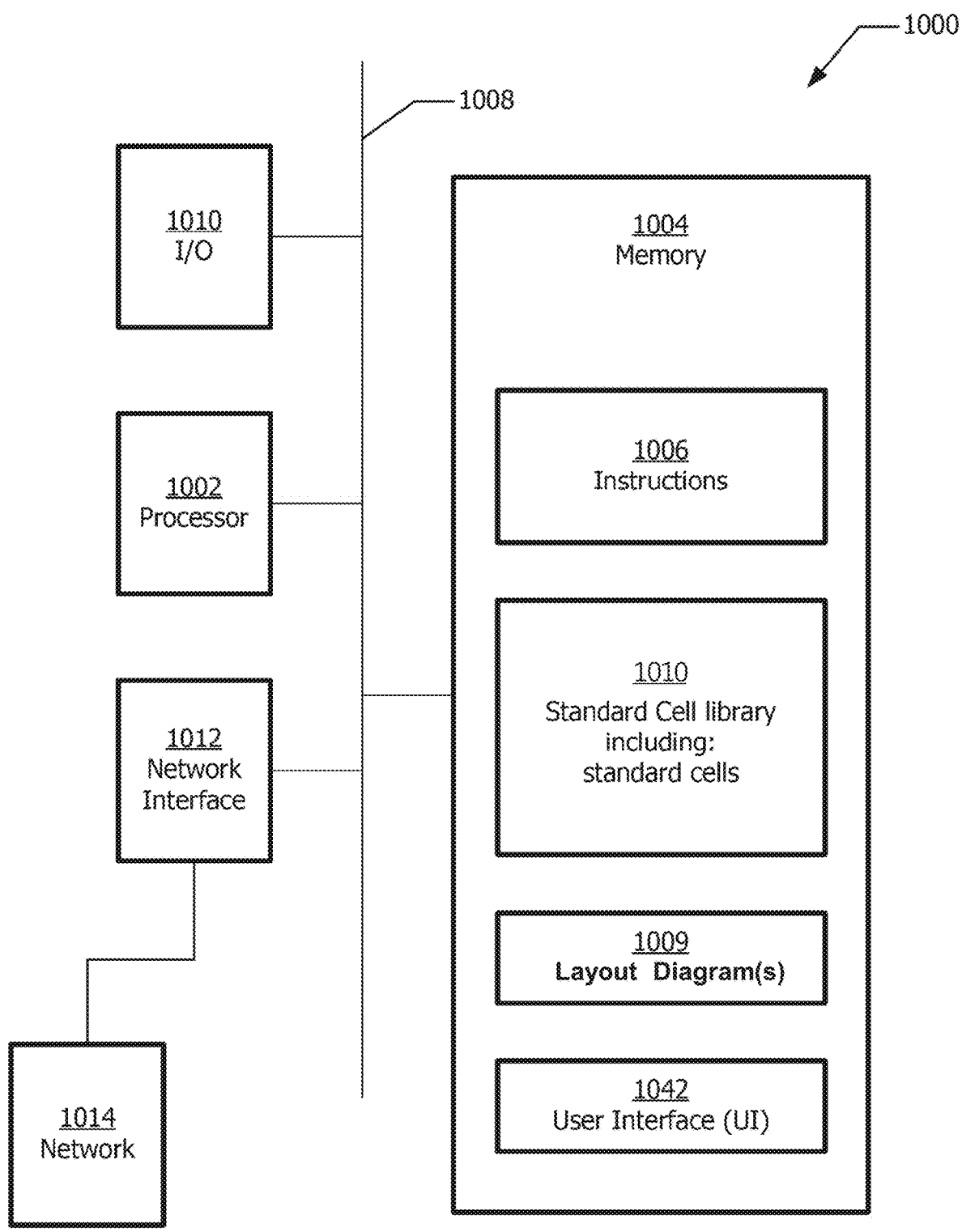
FIG. 10 is a block diagram of an electronic design automation (EDA) system, in accordance with some embodiments.

FIG. 10 is a block diagram of an electronic design automation (EDA) system 1000, in accordance with some embodiments.

In some embodiments, EDA system 1000 includes an APR system. Methods described herein of designing layout diagrams, in accordance with one or more embodiments, are implementable, for example, using EDA system 1000, in accordance with some embodiments.

In some embodiments, EDA system 1000 is a general purpose computing device including a hardware processor 1002 and a non-transitory, computer-readable storage medium 1004. Storage medium 1004, amongst other things, is encoded with, i.e., stores, computer program code 1006, i.e., a set of executable instructions. Execution of instructions 1006 by hardware processor 1002 represents (at least in part) an EDA tool which implements a portion or all of the methods described herein in accordance with one or more embodiments (hereinafter, the noted processes and/or methods).

Processor 1002 is electrically coupled to computer-readable storage medium 1004 via a bus 1008. Processor 1002 is also electrically coupled to an I/O interface 1010 by bus 1008. A network interface 1012 is also electrically connected to processor 1002 via bus 1008. Network interface 1012 is connected to a network 1014, so that processor 1002 and computer-readable storage medium 1004 are capable of connecting to external elements via network 1014. Processor 1002 is configured to execute computer program code 1006 encoded in computer-readable storage medium 1004 in order to cause system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause system 1000 (where such execution represents (at least in part) the EDA tool) to be usable for performing a portion or all of the noted processes and/or methods. In one or more embodiments, storage medium 1004 also stores information which facilitates performing a portion or all of the noted processes and/or methods. In one or more embodiments, storage medium 1004 stores library 1007 of standard cells including such standard cells as disclosed herein. In one or more embodiments, storage medium 1004 stores one or more layout diagrams 1009 corresponding to one or more layouts disclosed herein.

EDA system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

EDA system 1000 also includes network interface 1012 coupled to processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1000.

System 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. EDA system 1000 is configured to receive information related to a UI through I/O interface 1010. The information is stored in computer-readable medium 1004 as user interface (UI) 1042.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
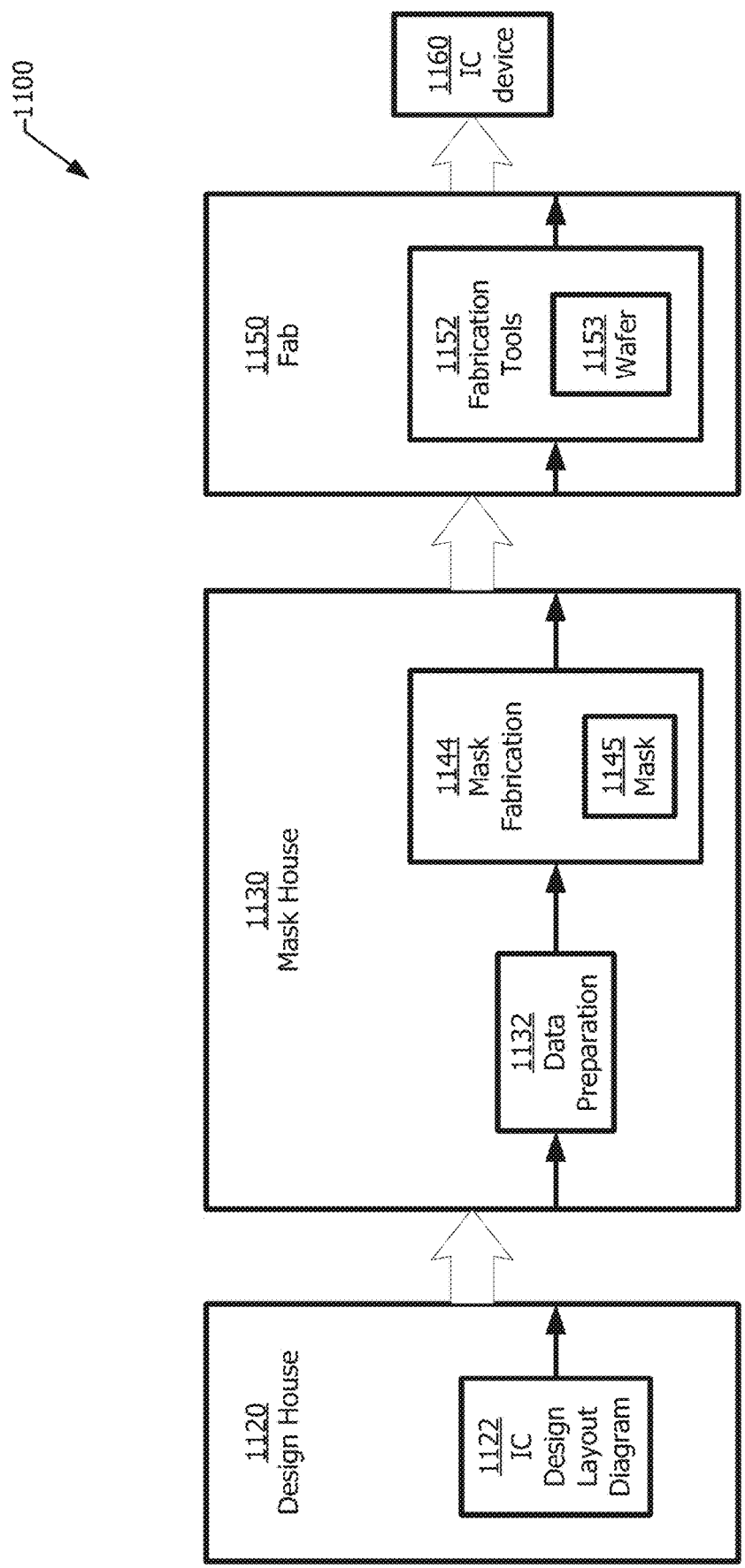
FIG. 11 is a block diagram of an integrated circuit (IC) manufacturing system, and an IC manufacturing flow associated therewith, in accordance with some embodiments.

FIG. 11 is a block diagram of an integrated circuit (IC) manufacturing system 1100, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file ("RDF"). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 includes fabrication tools 1152 configured to execute various manufacturing operations on semiconductor wafer 1153 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multi-level interconnects, and the like (formed at subsequent manufacturing steps).

Details regarding an integrated circuit (IC) manufacturing system (e.g., system 1100 of FIG. 11), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In an embodiment, a memory device includes: active regions extending in a first direction; gate electrodes which extend in a second direction that is perpendicular to the first direction, are substantially aligned relative to four corresponding track lines that extend in the second direction such that the memory device has a width of four contacted poly pitch (4 CPP) relative to the first direction, are electrically coupled to corresponding first portions of corresponding ones of the active regions, and are over the corresponding first portions relative to a third direction that is perpendicular to each of the first and second directions; contact-to-transistor-component structures (MD structures) which are over and electrically coupled to second corresponding portions of corresponding ones of the active regions, extend in the second direction, and are interspersed among corresponding ones of the gate electrodes; via-to-gate/MD (VGD) structures which are over and electrically coupled to corresponding ones of the gate electrodes and the MD structures; conductive segments which are in a first layer of metallization (M_1st layer), extend in the first direction, and are over and electrically coupled to corresponding ones of the VGD structures; buried contact-to-transistor-component structures (BVD structures) which are under and electrically coupled to third corresponding portions of corresponding ones of the active regions; and buried conductive segments which are in a first buried layer of metallization (BM_1st layer), extend in the first direction, and are under and electrically coupled to corresponding ones of the BVD structures, and correspondingly provide a first reference voltage or a second reference voltage.

In an embodiment, relative to the first direction, the memory device has a midline; and long axes correspondingly of the BVD structures are substantially aligned along the midline. In an embodiment, the BVD structures are rectangular and have corresponding long axes which extend in the second direction. In an embodiment, long axes correspondingly of the active regions extend in the first direction; short axes correspondingly of the active regions extend in the second direction; long axes correspondingly of the BVD structures extend in the second direction; and a size of the long axes of the BVD structures is substantially the same as a size of the short axes of the active regions. In an embodiment, a number of the BVD structures is the same as a number of the active regions; and the BVD structures overlap the active regions on a one-to-one (1:1) ratio. In an embodiment, relative to the second direction, each BVD structure is substantially centered on the corresponding active region. In an embodiment, first via structures which are over and electrically coupled to corresponding ones of the conductive segments in the M_1st layer; conductive segments which are in a second layer of metallization (M_2nd layer), extend in the second direction, and are over and electrically coupled to corresponding ones of the first via structures; second via structures which are over and electrically coupled to corresponding ones of the conductive segments in the M_2nd layer; conductive segments which are in a third layer of metallization (M_3rd layer), extend in the first direction, and are over and electrically coupled to corresponding ones of the second via structures; and first and second ones of the conductive segments in the M_3rd layer correspondingly are a bit line and a bit_bar line of the memory device. In an embodiment, first via structures which are over and electrically coupled to corresponding ones of the conductive segments in the M_1st layer; conductive segments which are in a second layer of metallization (M_2nd layer), extend in the second direction, and are over and electrically coupled to corresponding ones of the first via structures; one or more of the conductive segments in the M_2nd layer correspondingly are corresponding one or more write lines of the memory device; and each of the one or more write lines has a length in the second direction which is shorter than a Blech length. In some embodiments, the memory device is a six transistor, single port type of memory device. In an embodiment, the memory device is an eight transistor, dual port type of memory device; the memory device further includes: a memory latch; a write bit line (WBL) and a write bit_bar line (WBL_bar) correspondingly electrically coupled to the memory latch; and a first read bit line (RBL0) electrically coupled to the memory latch; and wherein: each of the WBL and the WBL_bar is shared with another memory device; and the RBL0 is not shared with another memory device. In an embodiment, the memory device further includes: write pass gates (WPGs) which are correspondingly electrically coupled to the memory latch; and read pass gates (RPGs) which are correspondingly electrically coupled to the memory latch; and wherein one of the following combinations is true: the WPGs are NMOS and the RPGs are PMOS; the WPGs are PMOS and the RPGs are NMOS; the WPGs are NMOS and the RPGs are NMOS; or the WPGs are PMOS and the RPGs are PMOS. In an embodiment, the memory device is a ten transistor, triple port type of memory device; the memory device further includes: a memory latch; a write bit line (WBL) and a write bit_bar line (WBL_bar) correspondingly electrically coupled to the memory latch; and a first read bit line (RBL(A)0), a second read bit line (RBL(A)1), a third read bit line (RBL(B)0) and a fourth read bit line (RBL(B)1) correspondingly electrically coupled to the memory latch; and wherein: each of the WBL and the WBL_bar is shared with another memory device; and none of the RBL(A)0, the RBL(A)1, the RBL(B)0 nor RBL(B)1 is shared with another memory device. In an embodiment, the memory device further includes: write pass gates (WPGs) which are correspondingly electrically coupled to the memory latch; and read pass gates (RPGs) which are correspondingly electrically coupled to the memory latch; and wherein the WPGs are NMOS and the RPGs are PMOS.

In an embodiment, a method (of manufacturing a semiconductor device including a memory cell region, for which a corresponding layout diagram of a corresponding memory cell is stored on a non-transitory computer-readable medium) includes generating the layout diagram including: generating active area (AA) patterns extending in a first direction; generating gate patterns which extend in a second direction that is perpendicular to the first direction, and are substantially aligned relative to four corresponding track lines that extend in the second direction such that the memory cell has a width of four contacted poly pitch (4 CPP) relative to the first direction; aligning the gate patterns over corresponding first portions of corresponding ones of the AA patterns relative to a third direction that is perpendicular to each of the first and second directions; generating contact-to-transistor-component patterns (MD patterns) which extend in the second direction; interspersing the MD patterns among corresponding ones of the gate patterns and over second corresponding portions of corresponding ones of the AA patterns; generating via-to-gate/MD (VGD) patterns; arranging the VGD patterns are over corresponding ones of the gate patterns and the MD patterns; generating conductive patterns which are designated for a first layer of metallization (M_1st patterns), and extend in the first direction; arranging the M_1st patterns over corresponding ones of the VGD patterns; generating buried contact-to-transistor-component patterns (BVD patterns; arranging the BVD patterns over third corresponding portions of corresponding ones of the AA patterns; configuring the BVD patterns to be rectangular with corresponding long axes which extend in the second direction; and generating buried conductive patterns which are designated for a first buried layer of metallization (BM_1st patterns), extend in the first direction, and are correspondingly designated to provide a first reference voltage or a second reference voltage; and arranging the BM_1st patterns under corresponding ones of the BVD patterns.

In an embodiment, the method further includes, based on the layout diagram, at least one of: (A) making one or more photolithographic exposure; (B) fabricating one or more semiconductor masks; or (C) fabricating at least one component in a layer of a semiconductor integrated circuit. In an embodiment, relative to the first direction, the memory cell has a midline; and the generating the layout diagram further includes: substantially aligning long axes correspondingly of the BVD patterns along the midline. In an embodiment, the generating the layout diagram further includes: configuring long axes correspondingly of the AA patterns to extend in the first direction; configuring short axes correspondingly of the AA patterns to extend in the second direction; configuring long axes correspondingly of the BVD patterns to extend in the second direction; and sizing the long axes of the BVD patterns and the short axes of the AA patterns to be substantially the same size. In an embodiment, the generating the layout diagram further includes: setting a number of the BVD patterns and a number of the AA patterns to be the same; and arranging the BVD patterns to overlap the AA patterns on a one-to-one (1:1) ratio. In an embodiment, the generating the layout diagram further includes: relative to the second direction, centering each BVD pattern substantially on the corresponding AA pattern.

In an embodiment, a memory device includes: active regions extending in a first direction; gate electrodes which extend in a second direction that is perpendicular to the first direction, are substantially aligned relative to four corresponding track lines that extend in the second direction such that the memory device has a width of four contacted poly pitch (4 CPP) relative to the first direction, are electrically coupled to corresponding first portions of corresponding ones of the active regions, and are over the corresponding first portions relative to a third direction that is perpendicular to each of the first and second directions; contact-to-transistor-component structures (MD structures) which are over and electrically coupled to second corresponding portions of corresponding ones of the active regions, extend in the second direction, and are interspersed among corresponding ones of the gate electrodes; via-to-gate/MD (VGD) structures which are over and electrically coupled to corresponding ones of the gate electrodes and the MD structures; conductive segments which are in a first layer of metallization (M_1st layer), extend in the first direction, and are over and electrically coupled to corresponding ones of the VGD structures; buried contact-to-transistor-component structures (BVD structures) which are under and electrically coupled to third corresponding portions of corresponding ones of the active regions; and buried conductive segments which are in a first buried layer of metallization (BM_1st layer), extend in the first direction, and are under and electrically coupled to corresponding ones of the BVD structures, and correspondingly provide a first reference voltage or a second reference voltage; and wherein: relative to the first direction, the memory device has a midline; and long axes correspondingly of the BVD structures are substantially aligned along the midline.

In an embodiment, the BVD structures are rectangular and have corresponding long axes which extend in the second direction. In an embodiment, long axes correspondingly of the active regions extend in the first direction; short axes correspondingly of the active regions extend in the second direction; long axes correspondingly of the BVD structures extend in the second direction; and a size of the long axes of the BVD structures is substantially the same as a size of the short axes of the active regions. In an embodiment, a number of the BVD structures is the same as a number of the active regions; the BVD structures overlap the active regions on a one-to-one (1:1) ratio; and relative to the second direction, each BVD structure is substantially centered on the corresponding active region.

In an embodiment, a semiconductor device includes: first and second write-word lines; and first and second memory cells, each of which includes: a memory latch including: a first PMOS transistor coupled between a first power-supply voltage and a first node; a first NMOS transistor coupled between the first node and a second power-supply voltage; a second PMOS transistor coupled between the first power-supply voltage and a second node; and a second NMOS transistor coupled in series between the second node and the second power-supply voltage; gate electrodes of the first PMOS transistor and the first NMOS transistor being coupled to the second node; and gate electrodes of the second PMOS transistor and the second NMOS transistor being coupled to the first node; a first pass gate coupled between the first node and a bit line; a second pass gate coupled between the second node and a bit_bar line; and gate electrodes of the first and second pass gates being coupled to a corresponding one of the first or second write-word lines; gate lines which are formed correspondingly over the active regions and which have corresponding long axes extending in a first direction; for each of the first and second memory cells, the gate electrodes of the first and second PMOS transistors, first and second NMOS transistors, first and second pass gates being coupled correspondingly to the gate lines; and the gate lines being organized into first, second, third and fourth sets which are non-overlapping relative to a second direction substantially perpendicular to the first direction, each set including two or more of the gate lines which have substantially collinear long axes; and each of the first and second memory cells being coupled to a corresponding one of the gate lines in each of the first, second, third and fourth sets such that each of the first and second memory cells is a four contacted poly pitch (4 CPP) memory cell. In an embodiment, the semiconductor device further includes: active regions extending in a second direction; channels of the first and second PMOS transistors, first and second NMOS transistors, first and second pass gates being formed correspondingly in the active regions; and one or more first power rails and one or more second power rails each of which is formed correspondingly under the active regions and each of which has a long axis extending in the second direction; each first power rail providing the first power-supply voltage; and each second power rail providing the second power-supply voltage. In an embodiment, each of the first and second pass gates is NMOS; or each of the first and second pass gates is PMOS. In an embodiment, the semiconductor device further includes: a first layer of metallization (M_1st layer) above the gate lines; a second layer of metallization (M_2nd layer) above the M_1st layer; and a third layer of metallization (M_3rd layer) above the M_2nd layer; and wherein: the bit line includes one or more conductive segments in the M_3rd layer; and the bit_bar line includes one or more conductive segments in the M_3rd layer. In an embodiment, the semiconductor device further includes: a first layer of metallization (M_1st layer) above the gate lines; and second layer of metallization (M_2nd layer) above the M_1st layer; and wherein: the first write-word line includes one or more conductive segments in the M_2nd layer; and the second write-word line includes one or more conductive segments in the M_2nd layer. In an embodiment, for the first write-word line, each of the one or more conductive segments in the M_2nd layer is an island; and for the second write-word line, each of the one or more conductive segments in the M_2nd layer is an island.

In an embodiment, a semiconductor device includes: first and second write-word lines; first and second read-word lines; and first and second read-bit lines; and first and second memory cells, each of which includes: a memory latch including: a first PMOS transistor coupled between a first power-supply voltage and a first node; a first NMOS transistor coupled between the first node and a second power-supply voltage; a second PMOS transistor coupled between the first power-supply voltage and a second node; and a second NMOS transistor coupled in series between the second node and the second power-supply voltage; gate electrodes of the first PMOS transistor and the first NMOS transistor being coupled to the second node; and gate electrodes of the second PMOS transistor and the second NMOS transistor being coupled to the first node; a first pass gate coupled between the first node and a write-bit line; a second pass gate coupled between the second node and a write-bit_bar line; and a pulling transistor coupled between a third node and either the first power-supply voltage or the second power-supply voltage; a third pass gate coupled between the third node and a corresponding one of the first or second read-bit lines; and gate electrodes of the first and second pass gates being coupled to a corresponding one of the first or second write-word lines; a gate electrode of the pulling transistor being coupled to either the first node or the second node; and gate lines which are formed correspondingly over the active regions and which have corresponding long axes extending in a first direction; for each of the first and second memory cells, the gate electrodes of the first and second PMOS transistors, first and second NMOS transistors, first , second and third pass gates and the pulling transistor being coupled correspondingly to the gate lines; and the gate lines being organized into first, second, third and fourth sets which are non-overlapping relative to a second direction substantially perpendicular to the first direction, each set including two or more of the gate lines which have substantially collinear long axes; and each of the first and second memory cells being coupled to a corresponding one of the gate lines in each of the first, second, third and fourth sets such that each of the first and second memory cells is a four contacted poly pitch (4 CPP) memory cell. In an embodiment, the semiconductor device of claim 40, further includes: first and second write-word lines; first, second, third and fourth read-word lines; and first, second, third and fourth read-bit lines; and first and second memory cells, each of which includes: a memory latch including: a first PMOS transistor coupled between a first power-supply voltage and a first node; a first NMOS transistor coupled between the first node and a second power-supply voltage; a second PMOS transistor coupled between the first power-supply voltage and a second node; and a second NMOS transistor coupled in series between the second node and the second power-supply voltage; gate electrodes of the first PMOS transistor and the first NMOS transistor being coupled to the second node; and gate electrodes of the second PMOS transistor and the second NMOS transistor being coupled to the first node; a first pass gate coupled between the first node and a write-bit line; a second pass gate coupled between the second node and a write-bit_bar line; and a first pulling transistor coupled between a third node and either the first power-supply voltage or the second power-supply voltage; a second pulling transistor coupled between a fourth node and either the first power-supply voltage or the second power-supply voltage; a third pass gate coupled between the third node and a corresponding one of the first or third second read-bit lines; and a fourth pass gate coupled between the fourth node and a corresponding one of the second or fourth read-bit lines; gate electrodes of the first and second pass gates being coupled to a corresponding one of the first or second write-word lines; a gate electrode of the first pulling transistor being coupled to the first node; and a gate electrode of the second pulling transistor being coupled to the second node; and gate lines which are formed correspondingly over the active regions and which have corresponding long axes extending in a first direction; for each of the first and second memory cells, the gate electrodes of the first and second PMOS transistors, first and second NMOS transistors, first, second, third and fourth pass gates and the first and second pulling transistor being coupled correspondingly to the gate lines; and the gate lines being organized into first, second, third and fourth sets which are non-overlapping relative to a second direction substantially perpendicular to the first direction, each set including two or more of the gate lines which have substantially collinear long axes; and each of the first and second memory cells being coupled to a corresponding one of the gate lines in each of the first, second, third and fourth sets such that each of the first and second memory cells is a four contacted poly pitch (4 CPP) memory cell.

An aspect of this description relates to a semiconductor device. The semiconductor device includes first and second write-word lines. The semiconductor device further includes first and second memory cells. Each of the memory cells includes a memory latch including. The memory latch includes a first PMOS transistor coupled between a first power-supply voltage and a first node; a first NMOS transistor coupled between the first node and a second power-supply voltage; a second PMOS transistor coupled between the first power-supply voltage and a second node; and a second NMOS transistor coupled in series between the second node and the second power-supply voltage; gate electrodes of the first PMOS transistor and the first NMOS transistor being coupled to the second node; and gate electrodes of the second PMOS transistor and the second NMOS transistor being coupled to the first node; a first pass gate coupled between the first node and a bit line; a second pass gate coupled between the second node and a bit_bar line. The transistors and the pass gates are in a transistor layer. Gate electrodes of the first and second pass gates are coupled to a corresponding one of the first or second write-word lines. Gate lines which are formed correspondingly over the active regions and which have corresponding long axes extending in a first direction. For each of the first and second memory cells, the gate electrodes of the first and second PMOS transistors, first and second NMOS transistors, first and second pass gates being coupled correspondingly to the gate lines. The gate lines are organized into first, second, third and fourth sets which are non-overlapping relative to a second direction substantially perpendicular to the first direction, each set including two or more of the gate lines which have substantially collinear long axes. Each of the first and second memory cells is coupled to a corresponding one of the gate lines in each of the first, second, third and fourth sets such that each of the first and second memory cells is a four contacted poly pitch memory cell. Power grid lines for the transistors and the pass gates are underneath the transistor layer. In some embodiments, the semiconductor device further includes active regions extending in a second direction; channels of the first and second PMOS transistors, first and second NMOS transistors, first and second pass gates being formed correspondingly in the active regions; and one or more first power rails and one or more second power rails each of which is formed correspondingly under the active regions and each of which has a long axis extending in the second direction; each first power rail providing the first power-supply voltage; and each second power rail providing the second power-supply voltage. In some embodiments, each of the first and second pass gates is NMOS; or each of the first and second pass gates is PMOS. In some embodiments, the semiconductor device further includes a first layer of metallization (M_1st layer) above the gate lines; a second layer of metallization (M_2nd layer) above the M_1st layer; and a third layer of metallization (M_3rd layer) above the M_2nd layer; and wherein the bit line includes one or more conductive segments in the M_3rd layer; and the bit_bar line includes one or more conductive segments in the M_3rd layer. In some embodiments, the semiconductor device further includes a first layer of metallization (M_1st layer) above the gate lines; and a second layer of metallization (M_2nd layer) above the M_1st layer; and wherein the first write-word line includes one or more conductive segments in the M_2nd layer; and the second write-word line includes one or more conductive segments in the M_2nd layer. In some embodiments, for the first write-word line, each of the one or more conductive segments in the M_2nd layer is an island; and for the second write-word line, each of the one or more conductive segments in the M_2nd layer is an island.

An aspect of this description relates to a method of forming a memory device. The method includes forming active regions in a substrate, the active regions extending in a first direction. The method further includes forming gate electrodes over and electrically coupled to corresponding first portions of corresponding ones of the active regions, the gate electrodes extending in a second direction that is perpendicular to the first direction, the gate electrodes being substantially aligned relative to four corresponding track lines that extend in the second direction such that the memory device has a width of four contacted poly pitch (4 CPP) relative to the first direction. The method further includes forming contact-to-transistor-component structures (MD structures) over and electrically coupled to corresponding second portions of corresponding ones of the active regions, the MD structures extending in the second direction and being interspersed among corresponding ones of the gate electrodes. The method further includes forming via-to-gate/MD (VGD) structures over and electrically coupled to corresponding ones of the gate electrodes and the MD structures. The method further includes forming unburied conductive segments over and electrically coupled to corresponding ones of the VGD structures, the unburied conductive segments being in a first unburied layer of metallization, and extending in the first direction. The method further includes forming buried contact-to-transistor-component structures (BVD structures) under and electrically coupled to corresponding third portions of corresponding ones of the active regions. The method further includes forming buried conductive segments under and electrically coupled to corresponding ones of the BVD structures, the buried conductive segments being in a first buried layer of metallization, extending in the first direction, and correspondingly providing a first reference voltage or a second reference voltage. In some embodiments, forming the buried conductive segments includes forming a first buried conductive segment for providing the first reference voltage; and forming a second buried conductive segment for providing the second reference voltage. In some embodiments, forming the buried conductive segments comprises forming a first buried conductive segment electrically coupled to a plurality of the BVD structures. In some embodiments, forming the gate electrodes includes forming a first gate electrode extending over a plurality of the active regions. In some embodiments, forming the gate electrodes includes forming a plurality of gate electrodes along a same track line, wherein each of the plurality of gate electrodes extends over a single active region of the active regions. In some embodiments, the method further includes forming a plurality of second MD structures, wherein each of the gate electrodes is between adjacent second MD structures of the plurality of MD structures. In some embodiments, forming the buried conductive segments includes forming a first buried conductive segment electrically coupled to a single BVD structure of the BVD structures. In some embodiments, forming the BVD structures includes forming each of the BVD structures offset from each of the gate electrodes and each of the MD structures in a plan view.

An aspect of this description relates to a memory device. The memory device includes active regions extending in a first direction. The memory device further includes gate structures extending in a second direction perpendicular to the first direction, wherein each of the gate structures is electrically coupled to a first portion of a corresponding active region of the active regions. The memory device further includes contact-to-transistor-component structures (MD structures), wherein each of the MD structures is over and electrically coupled a second portion of a corresponding active region of the active regions, and a first MD structure of the MD structures is between adjacent gate structures of the gate structures. The memory device further includes via-to-gate/MD (VGD) structures, wherein each of the VGD structures is over and electrically coupled to a corresponding gate electrode of the gate electrodes and a corresponding MD structure of the MD structures. The memory device further includes conductive segments, wherein each of the conductive segments is over and electrically coupled to a corresponding VGD structure of the VGD structures. The memory device further includes buried contact-to-transistor-component structures (BVD) structures, wherein each of the BVD structures is under and electrically coupled to a third portion of a corresponding active region of the active regions. The memory device further includes buried conductive segments, wherein each of the buried conductive segments is under and electrically coupled to a corresponding BVD structure of the BVD structures. In some embodiments, at least one of the buried conductive segments comprises a power rail. In some embodiments, each of the BVD structures is between adjacent gate structures of the gate structures in a plan view. In some embodiments, a first gate structure of the gate structures is between adjacent MD structures of the MD structures. In some embodiments, a first plurality of the gate structures extends over a plurality of the active regions. In some embodiments, a second plurality of the gate structures extends over a single active region of the active regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   first and second write-word lines; and
   first and second memory cells, each of which includes:
   a latch;
   a first pass gate coupled between an input node of the latch and a bit line;
   a second pass gate coupled between an output node of the latch and a bit_bar line;
   the latch and the first and second pass gates being in a transistor layer; and
   gate electrodes of the first and second pass gates being coupled to a corresponding one of the first or second write-word lines;
   gate lines which are correspondingly over the transistor layer and which have corresponding long axes extending in a first direction;
      for each latch, gate electrodes of transistors included therein being coupled correspondingly to the gate lines; and
   the gate lines being organized into first, second, third and fourth sets which are non-overlapping relative to a second direction substantially perpendicular to the first direction, each set including two or more of the gate lines which have substantially collinear long axes; and
   each of the first and second memory cells being coupled to a corresponding one of the gate lines in each of the first, second, third and fourth sets such that each of the first and second memory cells is a four contacted poly pitch memory cell; and
   power grid lines for the transistors and the pass gates being underneath the transistor layer.

2. The semiconductor device of claim 1, further comprising:
   active regions extending in the second direction;
   regarding the transistors included in the latch, channels thereof being formed correspondingly in the active regions; and
   one or more first power rails and one or more second power rails each of which is formed correspondingly under the active regions and each of which has a long axis extending in the second direction;
      each first power rail providing a first power-supply voltage; and
      each second power rail providing a second power-supply voltage.

3. The semiconductor device of claim 2, wherein:
   each of the first and second pass gates is NMOS; or
   each of the first and second pass gates is PMOS.

4. The semiconductor device of claim 1, further comprising:
   a first layer of metallization (M_1st layer) above the gate lines;
   a second layer of metallization (M_2nd layer) above the M_1st layer; and
   a third layer of metallization (M_3rd layer) above the M_2nd layer; and
   wherein:
      the bit line includes one or more conductive segments in the M_3rd layer;
   and
      the bit_bar line includes one or more conductive segments in the M_3rd layer.

5. The semiconductor device of claim 1, further comprising:
   a first layer of metallization (M_1st layer) above the gate lines; and
   a second layer of metallization (M_2nd layer) above the M_1st layer; and
   wherein:
      the first write-word line includes one or more conductive segments in the M_2nd layer; and
      the second write-word line includes one or more conductive segments in the M_2nd layer.

6. The semiconductor device of claim 5, wherein:
for the first write-word line, each of the one or more conductive segments in the M_2nd layer is an island; and
for the second write-word line, each of the one or more conductive segments in the M_2nd layer is an island.

7. A method of forming a memory device, the method comprising:
forming active regions in a substrate;
forming gate electrodes over and electrically coupled to corresponding first portions of corresponding ones of the active regions the gate electrodes being substantially aligned relative to four corresponding track lines such that the memory device has a width of four contacted poly pitch (4 CPP) relative to a direction perpendicular to long axes of the gate electrodes;
forming contact-to-transistor-component structures (MD structures) over and electrically coupled to corresponding second portions of corresponding ones of the active regions, the MD structures being interspersed among corresponding ones of the gate electrodes;
forming via-to-gate/MD (VGD) structures over and electrically coupled to corresponding ones of the gate electrodes and the MD structures;
forming unburied conductive segments over and electrically coupled to corresponding ones of the VGD structures, the unburied conductive segments being in a first unburied layer of metallization;
forming buried contact-to-transistor-component structures (BVD structures) under and electrically coupled to corresponding third portions of corresponding ones of the active regions; and
forming buried conductive segments under and electrically coupled to corresponding ones of the BVD structures, the buried conductive segments being in a first buried layer of metallization, and correspondingly providing a first reference voltage or a second reference voltage.

8. The method of claim 7, wherein forming the buried conductive segments comprises:
forming a first buried conductive segment for providing the first reference voltage; and
forming a second buried conductive segment for providing the second reference voltage.

9. The method of claim 7, wherein forming the buried conductive segments comprises forming a first buried conductive segment electrically coupled to corresponding ones of the BVD structures.

10. The method of claim 7, wherein forming the gate electrodes comprises forming a first gate electrode extending over corresponding ones of the active regions.

11. The method of claim 7, wherein the forming gate electrodes includes:
forming a first plurality of the gate electrodes along a same track line, wherein each one of the first plurality of the gate electrodes extends over a corresponding single one of the active regions.

12. The method of claim 7, wherein:
the forming contact-to-transistor-component structures (MD structures) forms first MD structures; and
the method further comprises:
forming second MD structures, wherein each of the gate electrodes is between adjacent corresponding ones of the second MD structures relative to a direction perpendicular to long axes of the MD structures.

13. The method of claim 7, wherein forming the buried conductive segments includes:
forming a first one of the buried conductive segments (first buried conductive segment) under and electrically coupled to a first one of the BVD structures (first BVD structure); and
wherein:
the first BVD structure electrically couples the first buried conductive segment to a first one of the active regions (first active region); and
relative to the memory device, the first BVD structure is an only one of the BVD structures to electrically couple the first buried conductive segment to the first active region.

14. The method of claim 7, wherein the forming buried contact-to-transistor-component structures (BVD structures) includes:
forming each of the BVD structures offset from each of the gate electrodes and each of the MD structures relative to a direction perpendicular to long axes of the gate electrodes and to long axes of the MD structures.

15. A memory device comprising:
active regions;
gate structures each of which is electrically coupled to a first portion of a corresponding active region of the active regions;
contact-to-transistor-component structures (MD structures) each of which is over and electrically coupled a second portion of a corresponding one of the active regions, and a first one of the MD structures is between adjacent ones of the gate structures;
via-to-gate/MD (VGD) structures each of which is over and electrically coupled to a corresponding one of the gate structures and a corresponding one of the MD structures;
conductive segments each of which is over and electrically coupled to a corresponding one of the VGD structures;
buried contact-to-transistor-component structures (BVD) structures each of which is under and electrically coupled to a third portion of a corresponding one of the active regions; and
buried conductive segments each of which is under and electrically coupled to a corresponding one of the BVD structures.

16. The memory device of claim 15, wherein at least one of the buried conductive segments comprises a power rail.

17. The memory device of claim 15, wherein each of the BVD structures is between adjacent ones of the gate structures relative to a direction perpendicular to long axes of the gate structures.

18. The memory device of claim 15, wherein a first one of the gate structures is between adjacent ones of the MD structures relative to a direction perpendicular to long axes of the MD structures.

19. The memory device of claim 15, wherein each one of a first plurality of the gate structures extends over corresponding ones of the active regions.

20. The memory device of claim 19, wherein each one of a second plurality of the gate structures extends over a corresponding single one of the active regions.

* * * * *